United States Patent
Wolk et al.

(10) Patent No.: US 10,220,600 B2
(45) Date of Patent: Mar. 5, 2019

(54) LAMINATION TRANSFER FILMS FOR FORMING REENTRANT STRUCTURES

(71) Applicant: 3M INNOVATIVE PROPERTIES COMPANY, St. Paul, MN (US)

(72) Inventors: Martin B. Wolk, Woodbury, MN (US); Olester Benson, Jr., Woodbury, MN (US); Terry O. Collier, Woodbury, MN (US); Michael Benton Free, St. Paul, MN (US); Adam J. Meuler, Woodbury, MN (US); Justin P. Meyer, Oakdale, MN (US); Evan L. Schwartz, Vadnais Heights, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/111,355

(22) PCT Filed: Jan. 9, 2015

(86) PCT No.: PCT/US2015/010767
§ 371 (c)(1),
(2) Date: Jul. 13, 2016

(87) PCT Pub. No.: WO2015/108773
PCT Pub. Date: Jul. 23, 2015

(65) Prior Publication Data
US 2016/0325536 A1 Nov. 10, 2016

Related U.S. Application Data

(60) Provisional application No. 61/929,425, filed on Jan. 20, 2014.

(51) Int. Cl.
*B32B 3/30* (2006.01)
*B44C 1/16* (2006.01)
(Continued)

(52) U.S. Cl.
CPC ............ *B32B 37/025* (2013.01); *B29C 43/00* (2013.01); *B32B 3/30* (2013.01); *B32B 27/08* (2013.01);
(Continued)

(58) Field of Classification Search
CPC ..... B29C 37/0025; B29C 37/00; B29C 43/00; B29C 45/00; B29C 47/00; B29C 49/00;
(Continued)

(56) References Cited

U.S. PATENT DOCUMENTS 5,453,104 A 9/1995 Schwabel
5,598,281 A 1/1997 Zimmerman
(Continued)

FOREIGN PATENT DOCUMENTS

CN 100446192 12/2008
CN 101443691 5/2009
(Continued)

OTHER PUBLICATIONS

Ahuja, "Nanonails: A Simple Geometrical Approach to Electrically Tunable Superlyophobic Surfaces," Langmuir, 2008, vol. 24, No. 1, pp. 9-14.
(Continued)

*Primary Examiner* — Sonya M Sengupta
(74) *Attorney, Agent, or Firm* — Jonathan L. Tolstedt

(57) ABSTRACT

Transfer films comprising a carrier film, a sacrificial template layer deposed on the carrier film and comprising reentrant forming template features, and a thermally stable backfill layer having a first surface conforming to the reentrant forming template features and forming reentrant features and an opposing planar second surface; and methods of making transfer films are disclosed.

22 Claims, 15 Drawing Sheets

(51) Int. Cl.

| | |
|---|---|
| *G02B 1/11* | (2015.01) |
| *B29C 37/00* | (2006.01) |
| *B29C 39/14* | (2006.01) |
| *B29C 41/24* | (2006.01) |
| *B29C 43/00* | (2006.01) |
| *B29C 45/00* | (2006.01) |
| *B29C 47/00* | (2006.01) |
| *B29C 51/00* | (2006.01) |
| *B23B 27/08* | (2006.01) |
| *B32B 27/20* | (2006.01) |
| *B32B 37/00* | (2006.01) |
| *B32B 37/12* | (2006.01) |
| *B32B 37/24* | (2006.01) |
| *B32B 38/06* | (2006.01) |
| *B32B 38/10* | (2006.01) |
| *C03C 17/00* | (2006.01) |
| *H01L 51/00* | (2006.01) |
| *H01L 51/52* | (2006.01) |
| *B32B 27/08* | (2006.01) |

(52) U.S. Cl.
CPC ............... *B32B 27/20* (2013.01); *B44C 1/16* (2013.01); *G02B 1/11* (2013.01); *H01L 51/003* (2013.01); *H01L 51/5262* (2013.01); *B29C 37/00* (2013.01); *B29C 37/0025* (2013.01); *B29C 39/14* (2013.01); *B29C 41/24* (2013.01); *B29C 45/00* (2013.01); *B29C 47/00* (2013.01); *B29C 51/00* (2013.01); *B32B 37/24* (2013.01); *B32B 38/06* (2013.01); *B32B 38/10* (2013.01); *B32B 2037/1253* (2013.01); *B32B 2037/243* (2013.01); *B32B 2264/102* (2013.01); *B32B 2307/40* (2013.01); *B32B 2307/748* (2013.01); *B32B 2310/0831* (2013.01); *B32B 2419/00* (2013.01); *B32B 2457/12* (2013.01); *B32B 2457/20* (2013.01); *B32B 2551/00* (2013.01); *C03C 17/00* (2013.01)

(58) Field of Classification Search
CPC ......... B29C 51/00; B29C 39/14; B29C 41/24; B44C 1/16; B44C 1/18; B32B 2037/1253; B32B 2037/243; B32B 2264/102; B32B 2307/40; B32B 2307/748; B32B 2310/0831; B32B 2419/00; B32B 2457/12; B32B 2457/20; B32B 2551/00; B32B 27/08; B32B 27/20; B32B 37/025; B32B 37/24; B32B 38/06; B32B 38/10; B32B 3/30; C03C 17/00; G02B 1/11; H01L 51/003; H01L 51/5262
USPC ............................... 156/232, 242, 278, 500
See application file for complete search history.

(56) References Cited

U.S. PATENT DOCUMENTS

| | | | |
|---|---|---|---|
| 6,329,058 B1 | 12/2001 | Arney | |
| 6,366,013 B1 | 4/2002 | Leenders | |
| 6,376,590 B2 | 4/2002 | Kolb | |
| 6,396,079 B1 | 5/2002 | Hayashi | |
| 6,521,324 B1* | 2/2003 | Debe | B41M 5/38207 156/235 |
| 6,858,253 B2* | 2/2005 | Williams | B05D 1/40 427/277 |
| 7,241,437 B2 | 7/2007 | Davidson | |
| 7,384,809 B2* | 6/2008 | Donofrio | H01L 33/0095 438/29 |
| 8,179,034 B2 | 5/2012 | Potts | |
| 9,246,134 B2* | 1/2016 | Schwartz | H01L 51/5281 |
| 9,419,250 B2 | 8/2016 | Schwartz | |
| 2003/0219992 A1 | 11/2003 | Schaper | |
| 2004/0265490 A1* | 12/2004 | Yang | B05D 1/42 427/240 |
| 2006/0270806 A1 | 11/2006 | Hale | |
| 2007/0042174 A1 | 2/2007 | Rao | |
| 2008/0197946 A1* | 8/2008 | Houck | B81B 3/0059 333/243 |
| 2009/0015142 A1 | 1/2009 | Potts | |
| 2009/0256287 A1 | 10/2009 | Fu | |
| 2009/0322219 A1* | 12/2009 | Wolk | B41M 5/38214 313/504 |
| 2010/0006211 A1 | 1/2010 | Wolk | |
| 2010/0080954 A1* | 4/2010 | Mohseni | G03F 7/20 428/131 |
| 2010/0104807 A1 | 4/2010 | Chiu | |
| 2010/0151207 A1 | 6/2010 | Hansen | |
| 2010/0160577 A1 | 6/2010 | Hirano | |
| 2011/0128536 A1* | 6/2011 | Bond | B82Y 20/00 356/301 |
| 2011/0182805 A1 | 7/2011 | DeSimone | |
| 2011/0278772 A1* | 11/2011 | Inamiya | B29C 59/022 264/496 |
| 2011/0305787 A1 | 12/2011 | Ishii | |
| 2012/0099323 A1 | 4/2012 | Thompson | |
| 2013/0319522 A1 | 12/2013 | Kioke | |
| 2014/0021492 A1* | 1/2014 | Wolk | H01L 51/5275 257/88 |
| 2014/0175707 A1 | 6/2014 | Wolk | |
| 2014/0178646 A1* | 6/2014 | Wolk | B32B 3/263 428/161 |
| 2014/0242343 A1 | 8/2014 | Free | |
| 2014/0360655 A1* | 12/2014 | Amemiya | B29C 59/04 156/209 |
| 2015/0202834 A1* | 7/2015 | Free | B32B 37/025 428/141 |
| 2016/0096316 A1 | 4/2016 | Wolk | |
| 2016/0104851 A1 | 4/2016 | Wolk | |
| 2016/0318277 A1 | 11/2016 | Schwartz | |

FOREIGN PATENT DOCUMENTS

| | | |
|---|---|---|
| WO | WO 2004/027460 | 4/2004 |
| WO | WO 2007/120464 | 10/2007 |
| WO | WO 2008-118610 | 10/2008 |
| WO | WO 2011-088161 | 7/2011 |
| WO | WO 2012-077738 | 6/2012 |
| WO | WO 2012-138554 | 10/2012 |
| WO | WO 2014/012039 | 1/2014 |
| WO | WO 2015-069444 | 5/2015 |

OTHER PUBLICATIONS

Bhushan, "Micro-, Nano- and Hierarchical Structures for Superhydrophobicity, Self-Cleaning, and Low Adhesion," Philosophical Transactions of the Royal Society A, Mar. 2009, vol. 367, No. 1894, pp. 1631-1672.

Chekurov, "The Fabrication of Silicon Nanostructures by Local Gallium Implantation and Cryogenic Deep Reactive Ion Etching," Nanotechnology, Jan. 2009, vol. 20 (065307), No. 6, pp. 1-5.

Chen, "Photosensitive Sacrificial Polymer With Low Residue," Microelectronic Engineering, Oct. 2011, vol. 88, No. 10, pp. 3087-3093.

Chiniwalla, "Multilayer Planarization of Polymer Dielectrics," IEEE Transactions on Advanced Packaging, Feb. 2001, vol. 24, No. 1, pp. 41-53.

Dufour, "From Micro to Nano Reentrant Structures: Hysteresis on Superomniphobic Surfaces," Colloid Polymer Science, Feb. 2013, vol. 291, No. 2, pp. 409-415.

Im "A Robust Superhydrophobic and Superoleophobic Surface with Inverse-Trapezoidal Microstructures on a Large Transparent Flexible Substrate," Soft Matter, 2010, vol. 6, pp. 1401-1404.

Kim, "Effects of the Substrate Pretreatments on the Leakage Current in the Low-Temperature Poly-Si TFTs," Materials Research Society Symposium Proceedings, 1997, vol. 448, pp. 419-423.

(56) References Cited

OTHER PUBLICATIONS

Kondoh, "Surface Treatment of Sheet Glass. Present Status and Future Prospects," Journal of Non-Crystalline Solids, Nov. 1994, vol. 178, pp. 189-198.
Kota, "Hierarchically Structured Superoleophobic Surfaces with Ultralow Contact Angle Hysteresis," Advanced Material, Nov. 2012, vol. 24, No. 43, pp. 5838-5843.
Lee, "Superamphiphobic Surface by Nanotransfer Molding and Isotropic Etching," Langmuir, May 2013, vol. 29, No. 25, pp. 8070-8075.
Mistler, Tape Casting: Theory and Practice, 37-45, (2000).
Shaw, "Negative Photoresists for Optical Lithography," IBM Journal of Research and Development, Jan. 1997, vol. 41, No. 1/2, pp. 81-94.
Tuteja, "Designing Superoleophobic Surfaces," Science, Dec. 2007, vol. 318, pp. 1618-1622.
Tuteja, "Robust Omniphobic Surfaces," PNAS, Nov. 2008, vol. 105, No. 47, pp. 18200-18205.
Wu, "Photoinitiation Systems and Thermal Decomposition of Photodefinable Sacrificial Materials," Journal of Applied Polymer Science, May 2003, vol. 88, No. 5, pp. 1186-1195.
Zhao, "Fabrication, Surface Properties, and Origin of Superoleophobicity for a Model Textured Surface," Langmuir, Apr. 2011, vol. 27, No. 10, pp. 5927-5935.
International Search Report for PCT International Patent Application No. PCT/US2015/010767, dated Apr. 27, 2015, 5 pages.
U.S. Appl. No. 15/257,099, filed Sep. 6, 2016.

\* cited by examiner

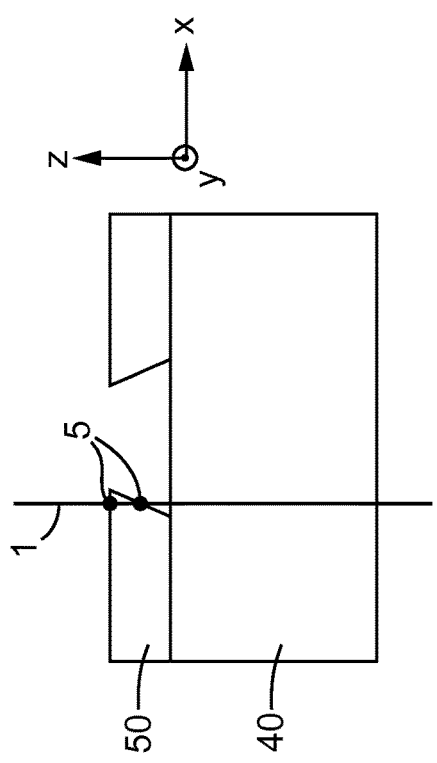
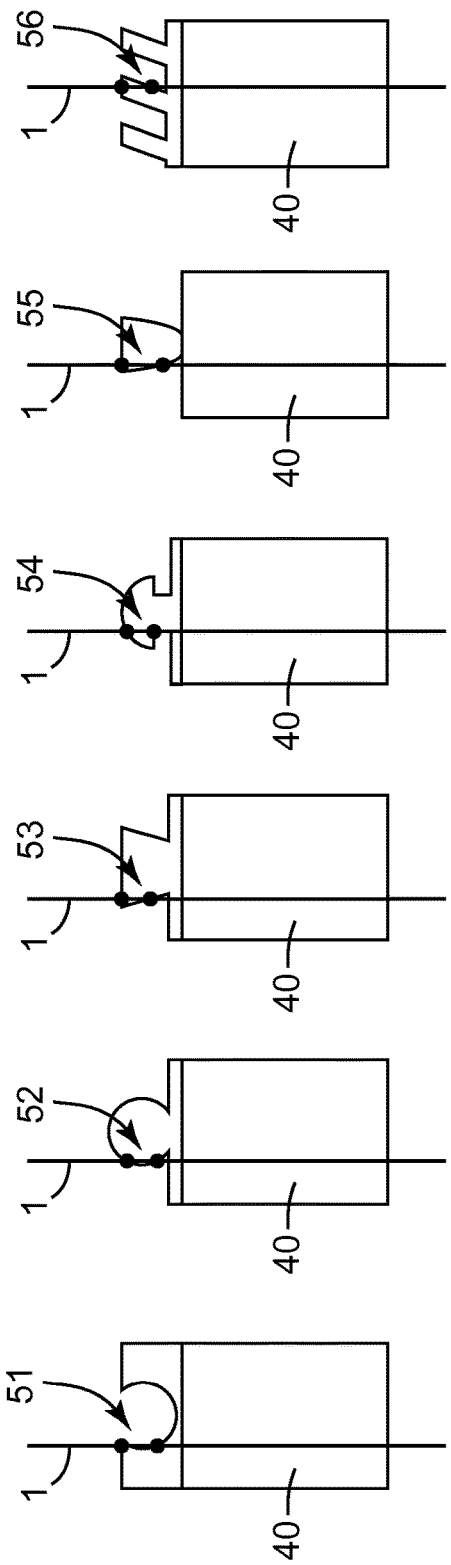

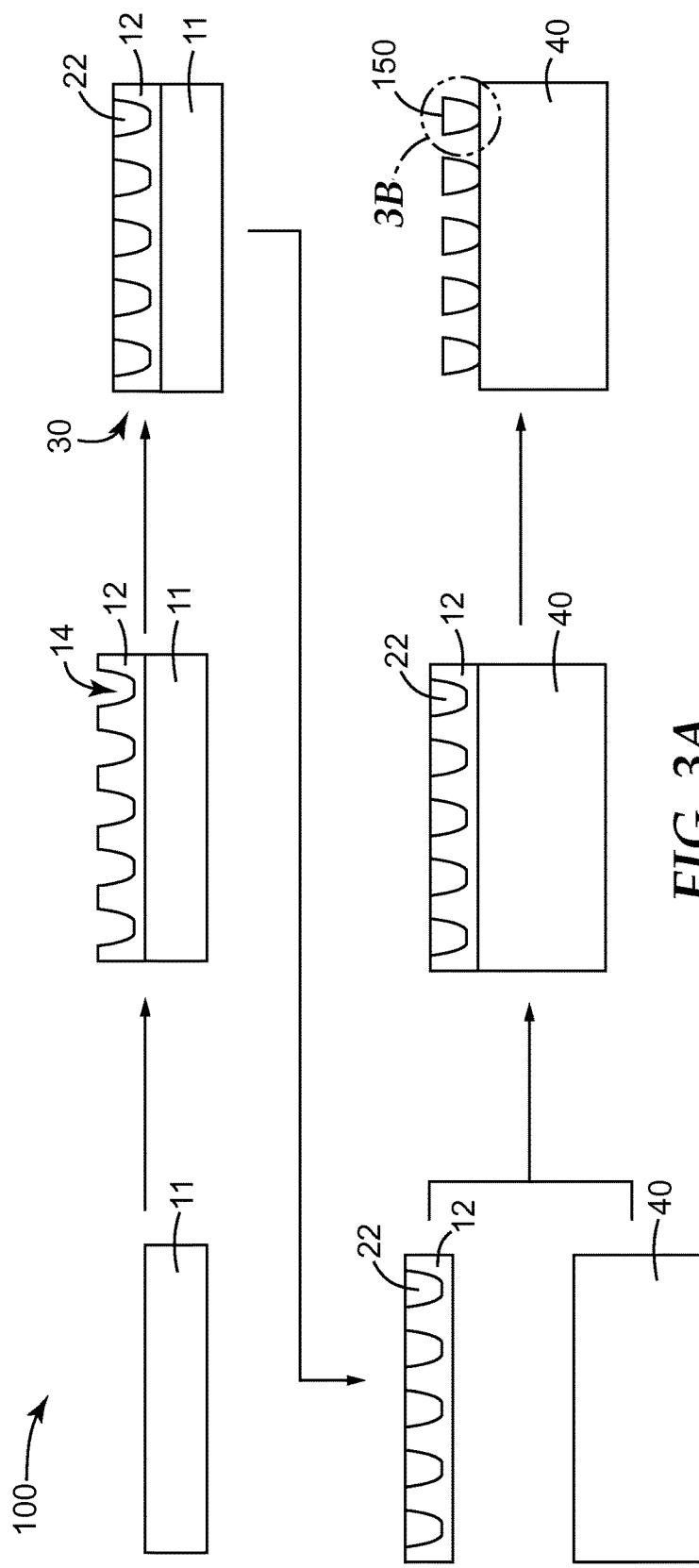

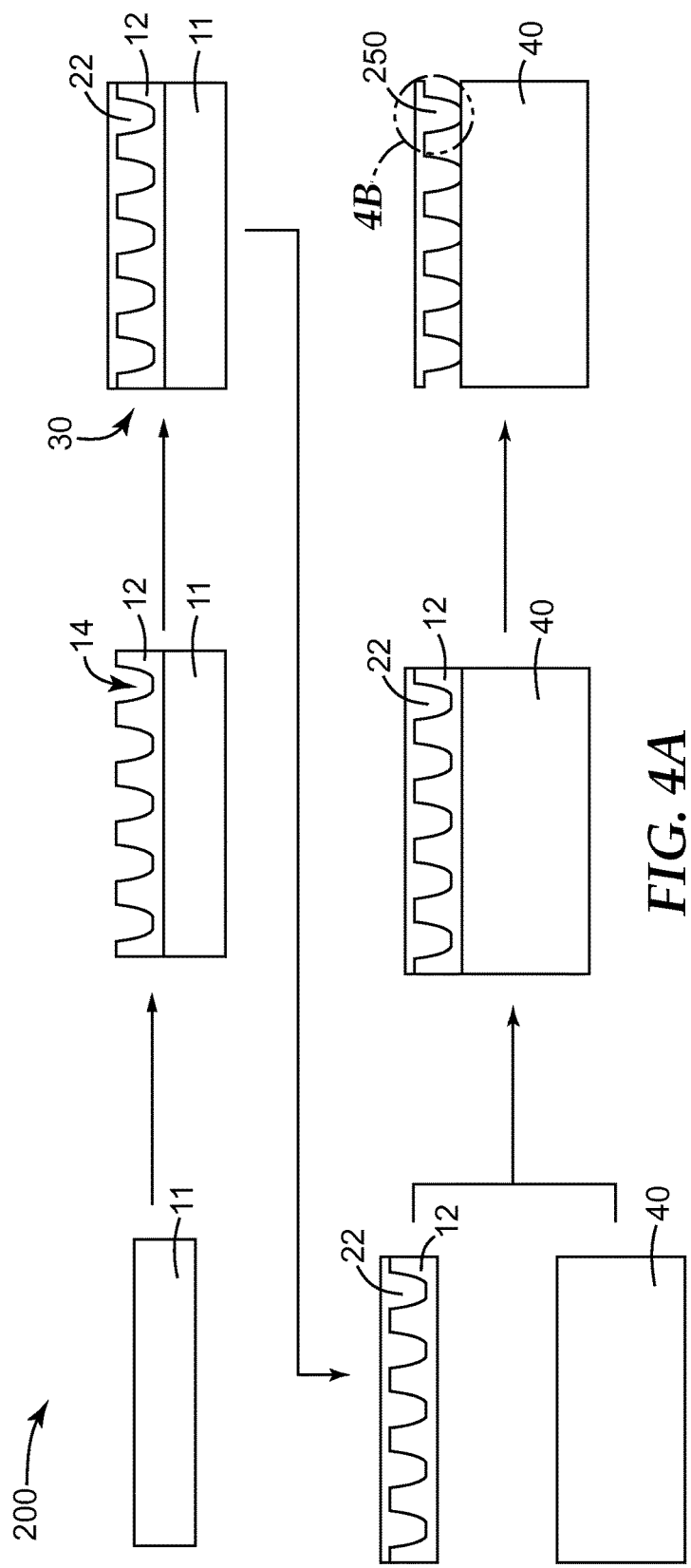

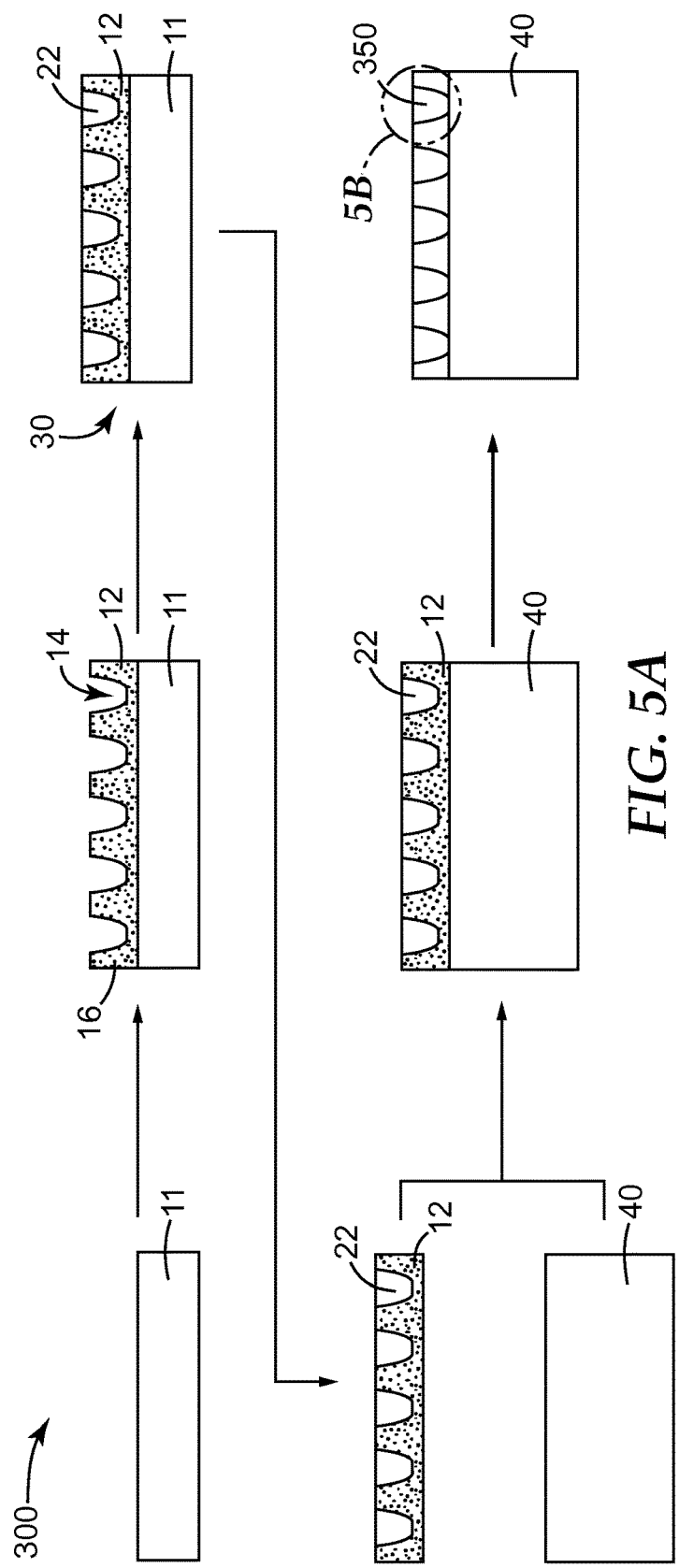

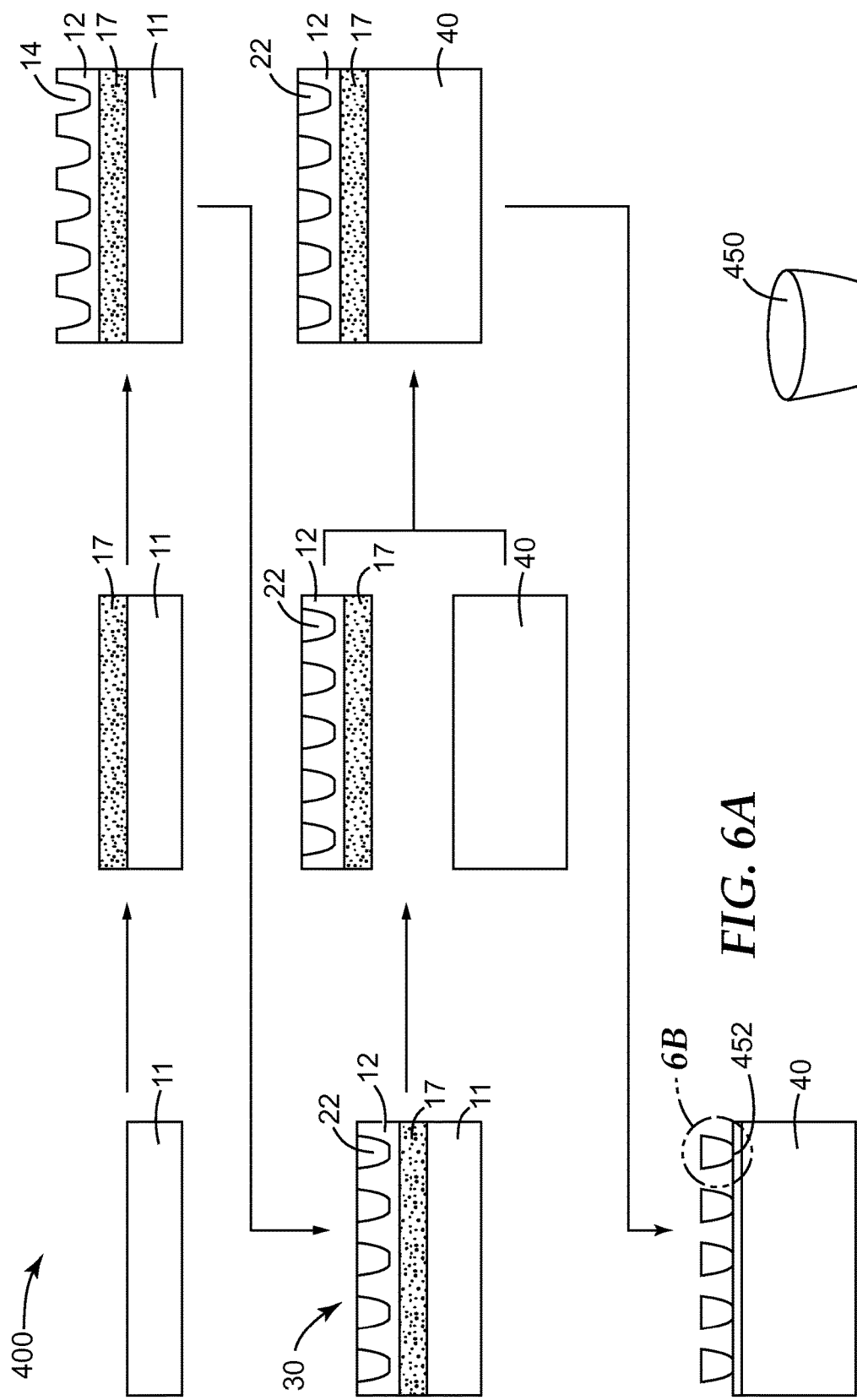

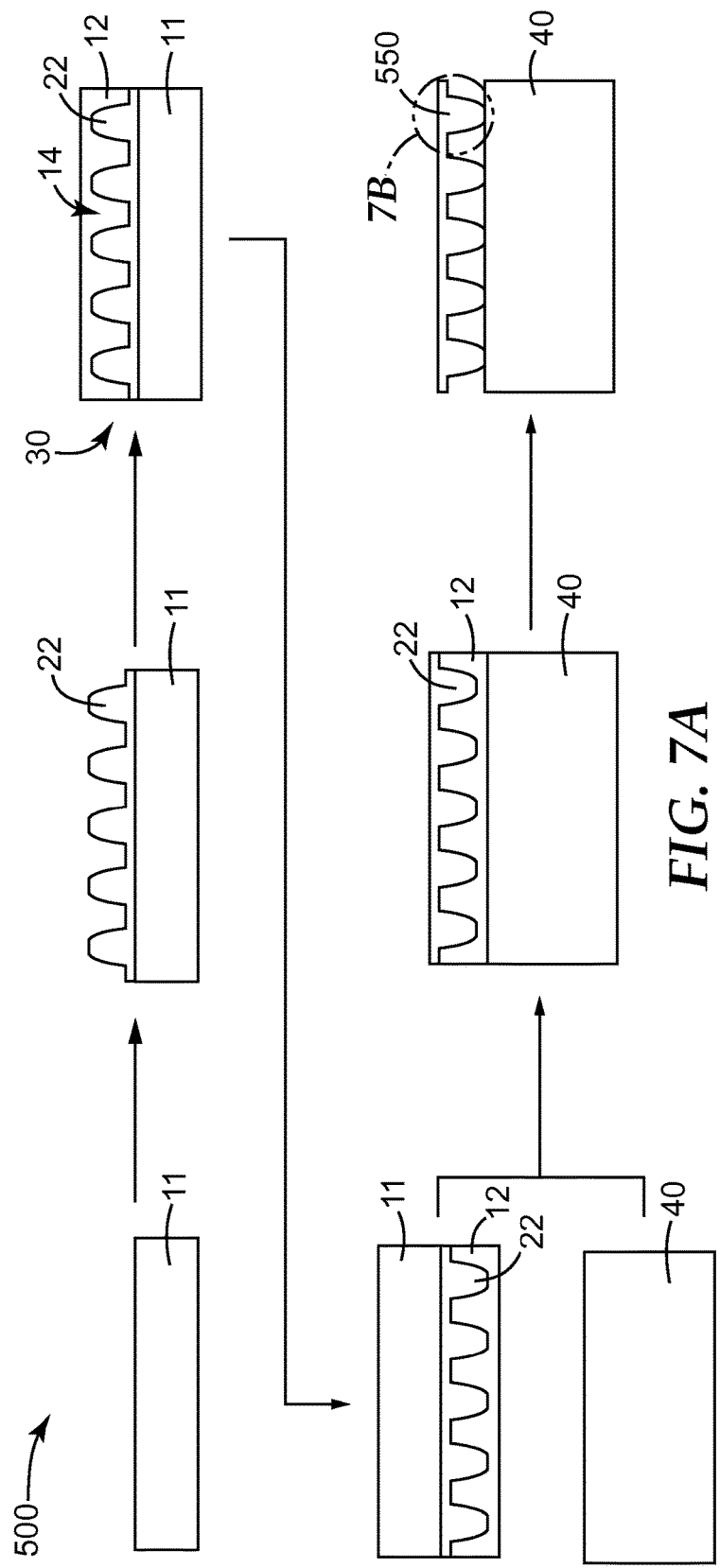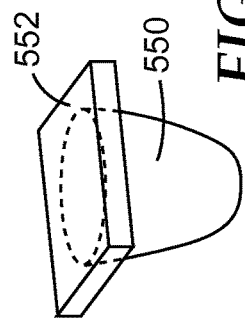
FIG. 7A
FIG. 7B

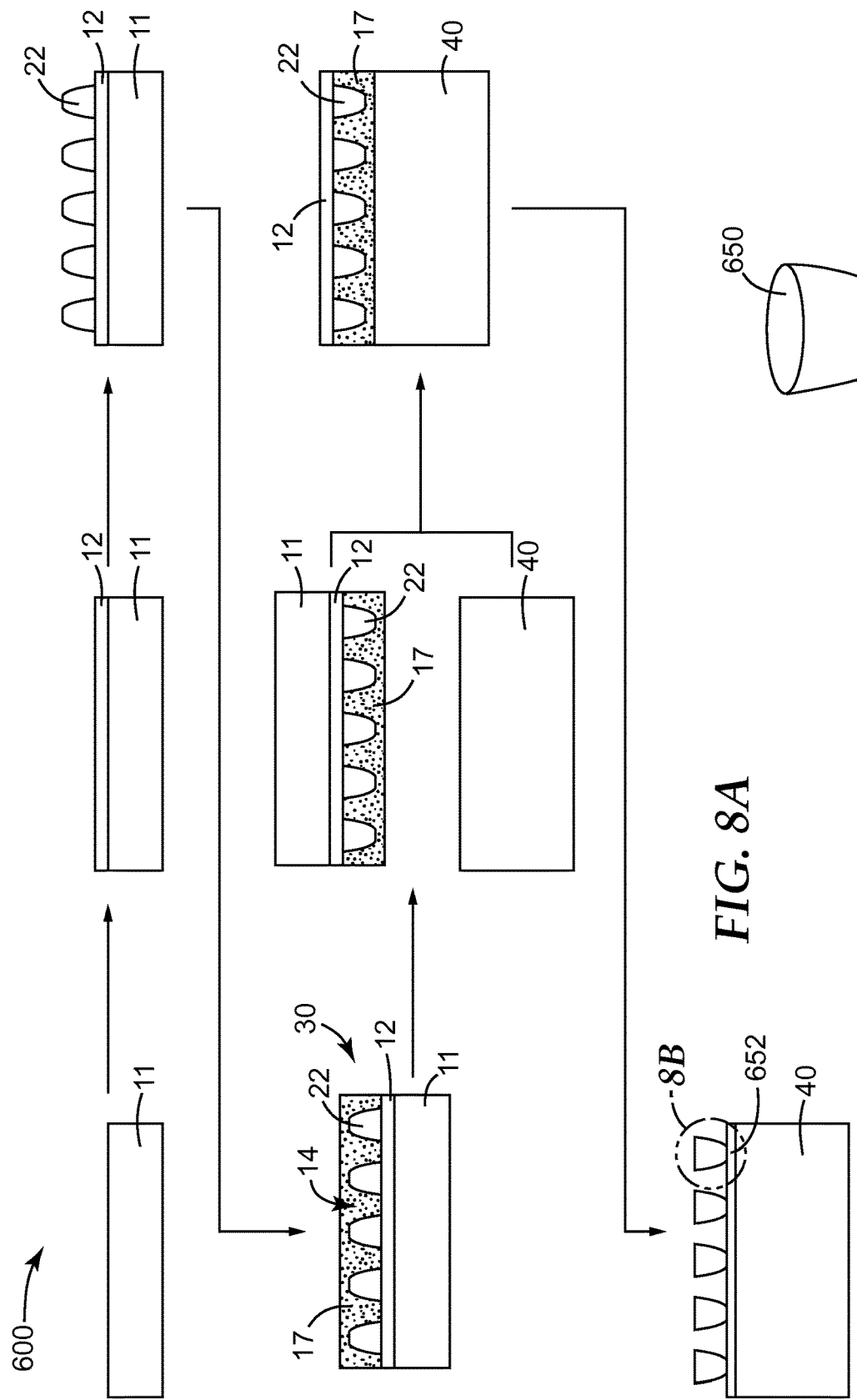

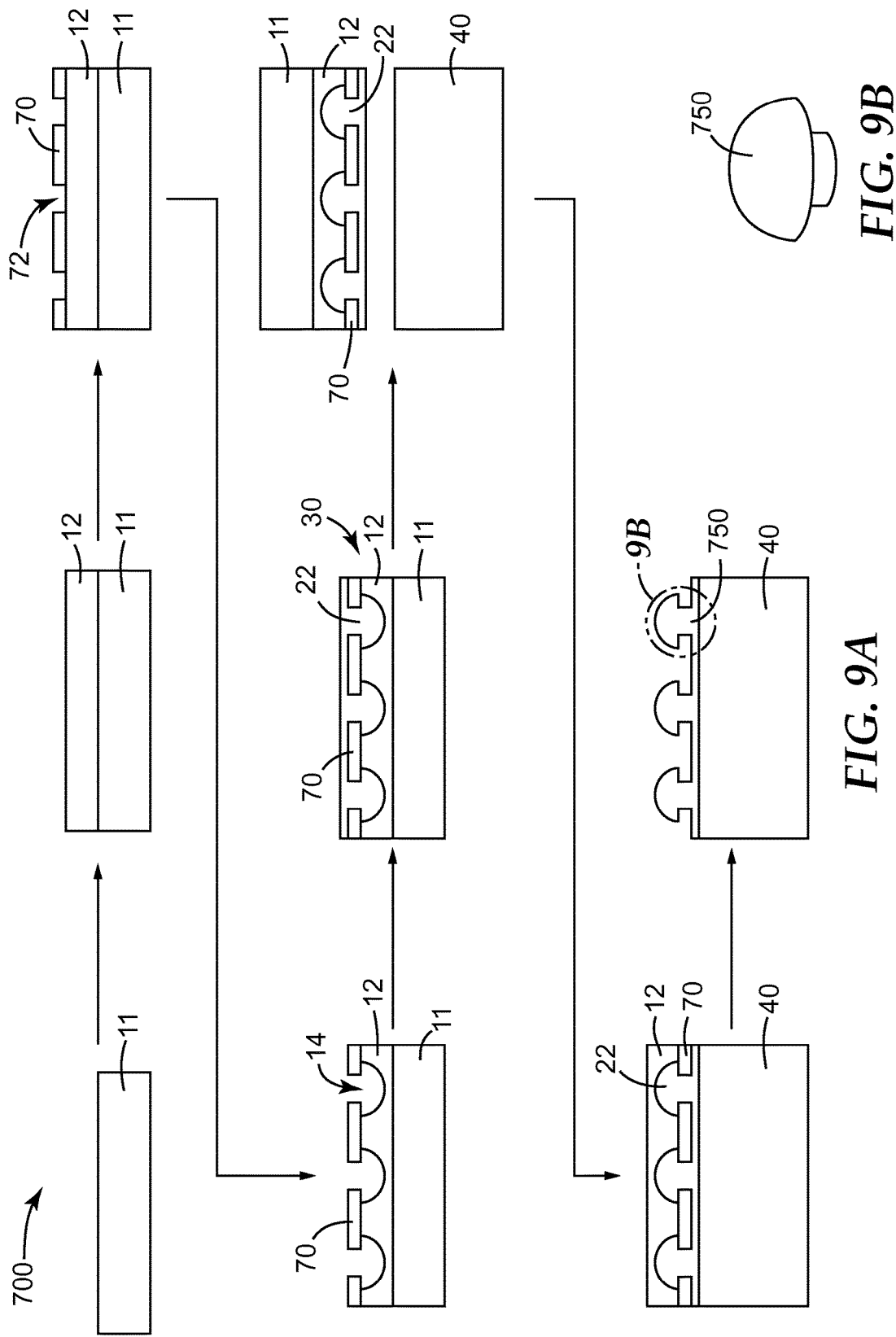

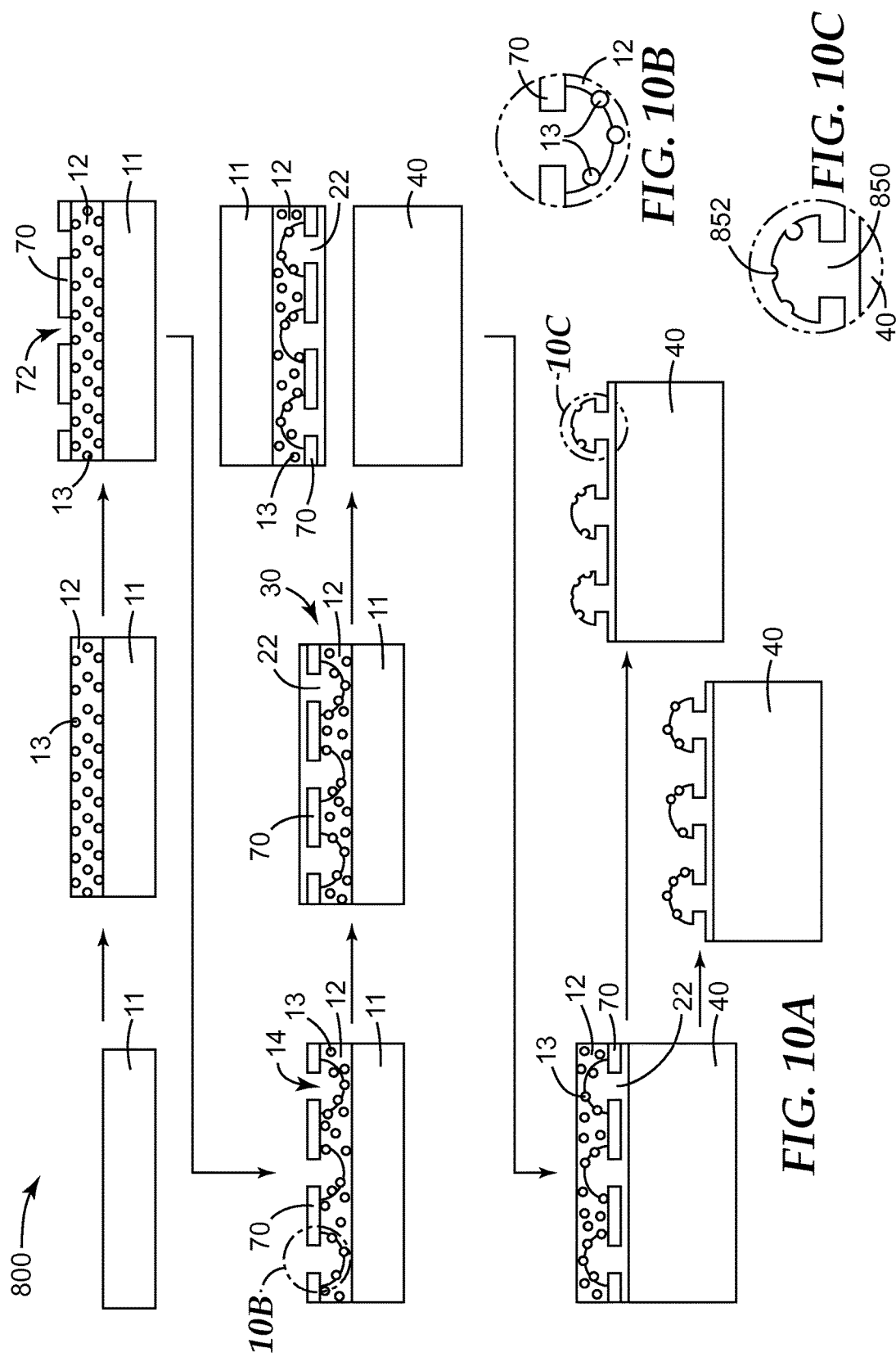

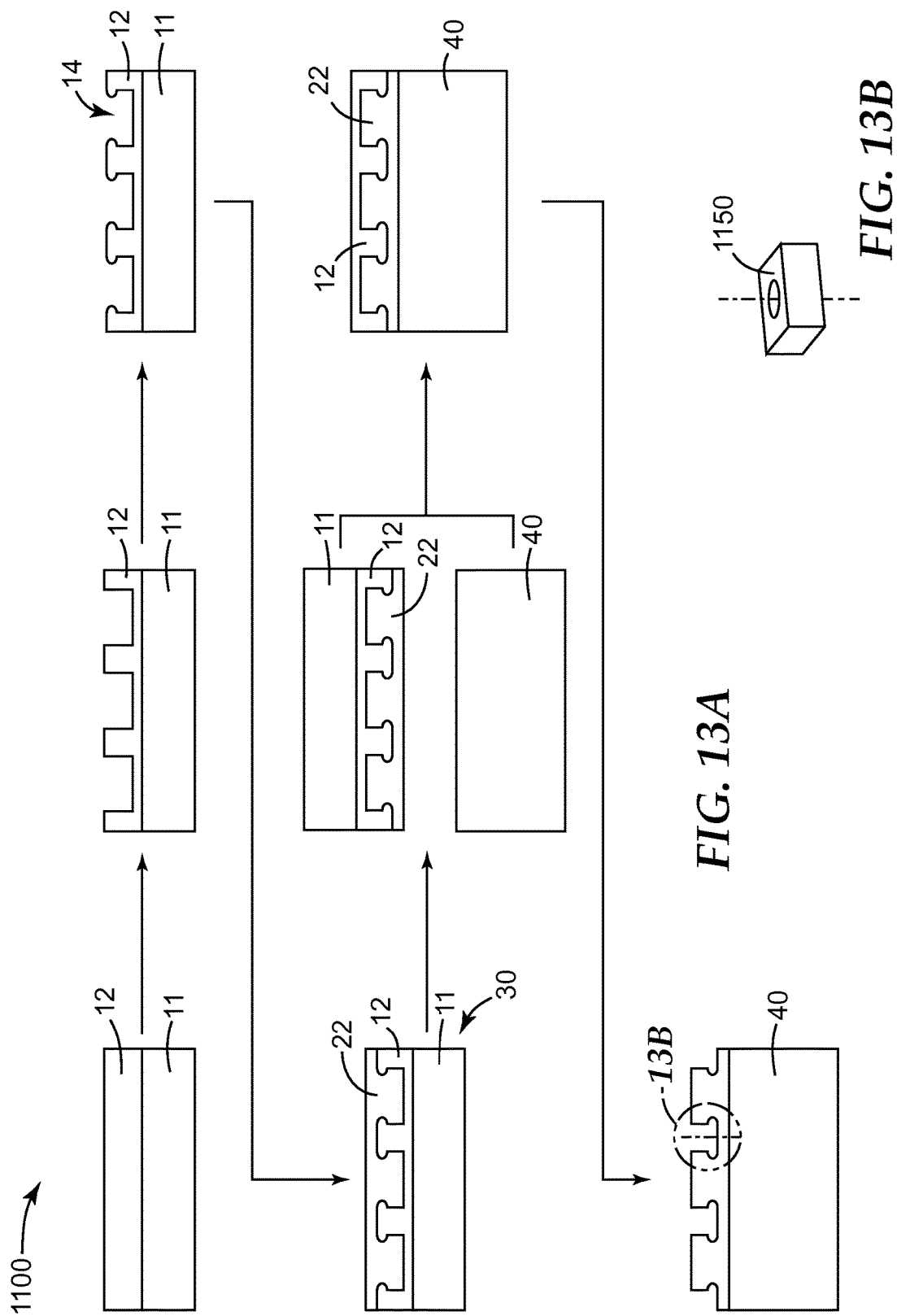

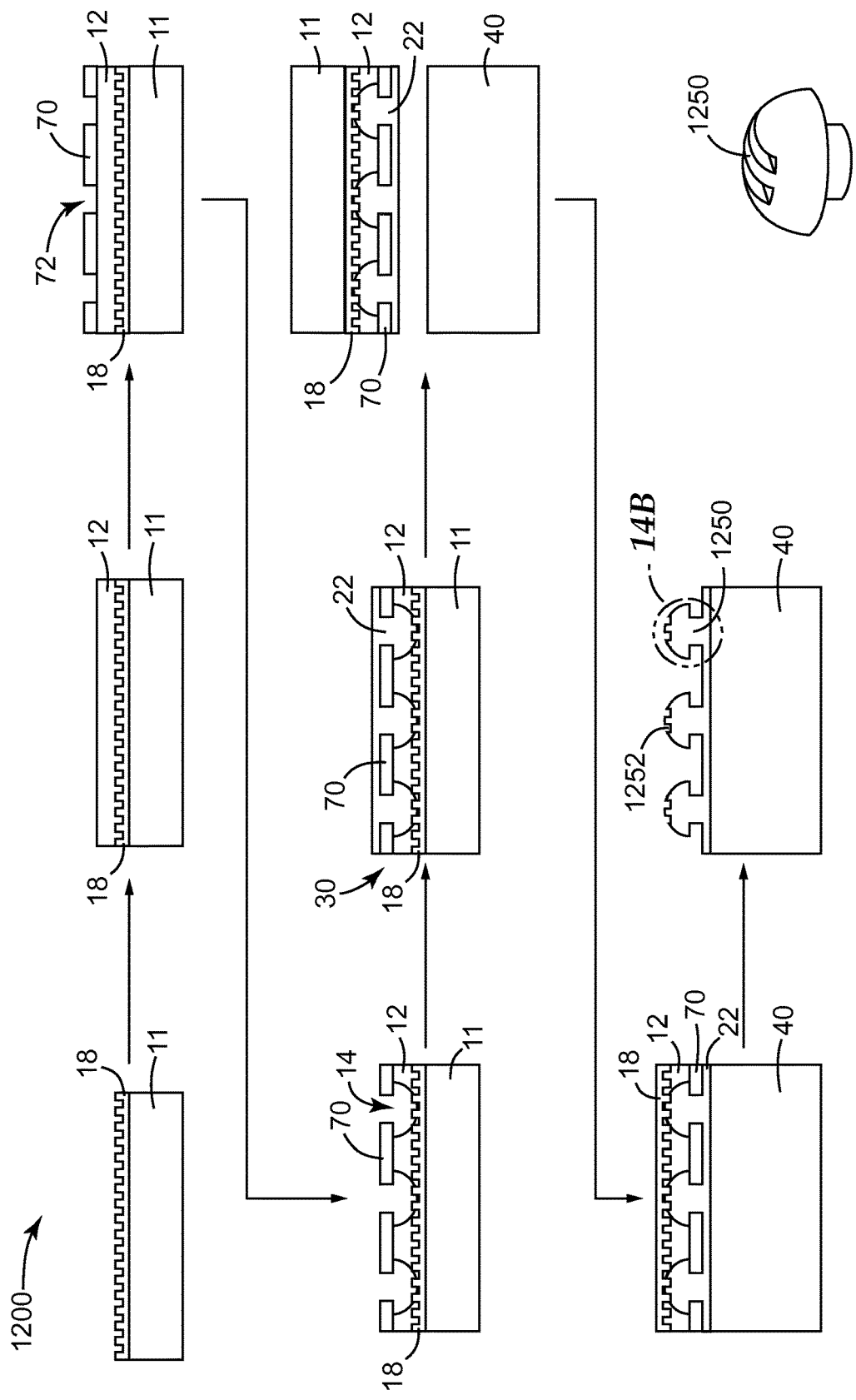

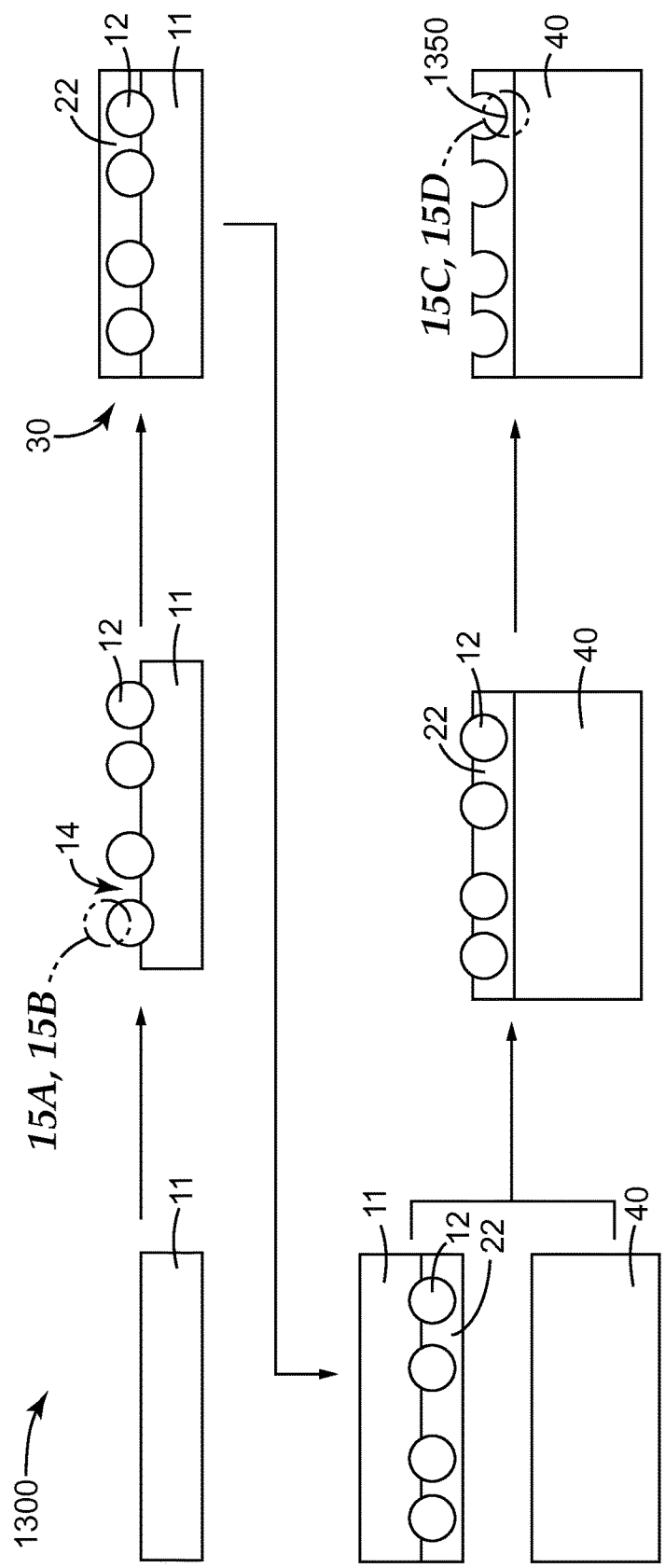
FIG. 15A
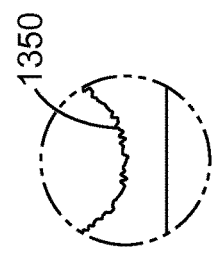
FIG. 15B
FIG. 15C
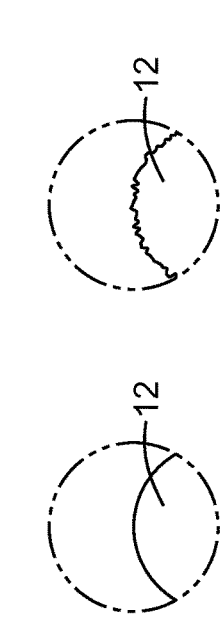
FIG. 15D
FIG. 15E

LAMINATION TRANSFER FILMS FOR FORMING REENTRANT STRUCTURES

CROSS REFERENCE TO RELATED APPLICATIONS

This application is a national stage filing under 35 U.S.C. 371 of PCT/US2015/010767, filed Jan. 9, 2015, which claims the benefit of U.S. Provisional Application No. 61/929,425, filed Jan. 20, 2014, the disclosures of which are incorporated by reference in their entirety herein.

BACKGROUND

Nanostructures and microstructures on glass substrates are used for a variety of applications in display, lighting, architecture and photovoltaic devices. In display devices the structures can be used for light extraction or light distribution. In lighting devices the structures can be used for light extraction, light distribution, and decorative effects. In photovoltaic devices the structures can be used for solar concentration and antireflection. Patterning or otherwise forming microstructures on large glass substrates can be difficult and cost-ineffective.

SUMMARY

The present disclosure relates to lamination transfer films for forming articles with reentrant structures and method of forming these lamination transfer films.

In one aspect, a transfer film includes a carrier film, a sacrificial template layer disposed on the carrier film and having reentrant forming template features and a thermally stable backfill layer having a first surface conforming to the reentrant forming template features and forming reentrant features and an opposing planar second surface.

In another aspect, a method of forming a transfer film includes disposing a sacrificial template layer on a carrier film, and forming reentrant forming template features in the sacrificial template layer, and coating a thermally stable backfill material on the sacrificial template layer to from a thermally stable backfill layer. The thermally stable backfill layer has a first surface conforming to the reentrant forming template features and an opposing planar second surface.

In another aspect, a method includes laminating the planar second surface of the transfer film described herein to a receptor substrate, and baking out the sacrificial template layer to form a thermally stable backfill layer having reentrant features.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 1 is a schematic diagram of an illustrative reentrant feature;

FIG. 2A-F are a schematic diagrams of six illustrative reentrant features;

FIG. 3A is a schematic process flow diagram of an illustrative method of forming the transfer film and resulting final reentrant elliptic paraboloid structure;

FIG. 3B is an enlargement of the final reentrant elliptic paraboloid structure of FIG. 3A;

FIG. 4A is a schematic process flow diagram of an illustrative method of forming the transfer film and resulting final reentrant elliptic paraboloid structure with a connecting planar element;

FIG. 4B is an enlargement of the final reentrant elliptic paraboloid structure of FIG. 4A;

FIG. 5A is a schematic process flow diagram of an illustrative method of forming the transfer film and resulting final reentrant elliptic paraboloid structure embedded in a layer;

FIG. 5B is an enlargement of the final reentrant elliptic paraboloid structure of FIG. 5A;

FIG. 6A is a schematic process flow diagram of another illustrative method of forming the transfer film and resulting final reentrant elliptic paraboloid structure;

FIG. 6B is an enlargement of the final reentrant elliptic paraboloid structure of FIG. 6A:

FIG. 7A is a schematic process flow diagram of another illustrative method of forming the transfer film and resulting final reentrant elliptic paraboloid structure with a connecting planar element;

FIG. 7B is an enlargement of the final reentrant elliptic paraboloid structure of FIG. 7A;

FIG. 8A is a schematic process flow diagram of another illustrative method of forming the transfer film and resulting final reentrant elliptic paraboloid structure;

FIG. 8B is an enlargement of the final reentrant elliptic paraboloid structure of FIG. 8A;

FIG. 9A is a schematic process flow diagram of another illustrative method of forming the transfer film by etching and the resulting final reentrant structure;

FIG. 9B is an enlargement of the final reentrant structure of FIG. 9A;

FIG. 10A is a schematic process flow diagram of another illustrative method of forming the transfer film by etching and the resulting final reentrant structure with hierarchical structure;

FIG. 10B is an enlargement of the reentrant template structure with hierarchical structure of FIG. 10A;

FIG. 10C is an enlargement of the final reentrant structure with hierarchical structure of FIG. 10A;

FIG. 13A is a schematic process flow diagram of another illustrative method of forming the transfer film by embossing and deformation and the resulting final reentrant structure;

FIG. 13B is an enlargement of the final reentrant structure of FIG. 13A;

FIG. 14A is a schematic process flow diagram of another illustrative method of forming the transfer film by etching and the resulting final reentrant structure with hierarchical structure;

FIG. 14B is an enlargement of the final reentrant structure of FIG. 14A;

FIG. 15A is a schematic process flow diagram of another illustrative method of forming the transfer film and resulting final reentrant hole segment of a sphere structure;

FIG. 15B is an enlargement of the reentrant template structure without hierarchical structure of FIG. 15A;

FIG. 15C is an enlargement of the reentrant template structure with hierarchical structure of FIG. 15A;

FIG. 15D is an enlargement of the reentrant structure without hierarchical structure of FIG. 15A;

FIG. 15E is an enlargement of the reentrant template structure with hierarchical structure of FIG. 15A.

DETAILED DESCRIPTION

Figure 11:
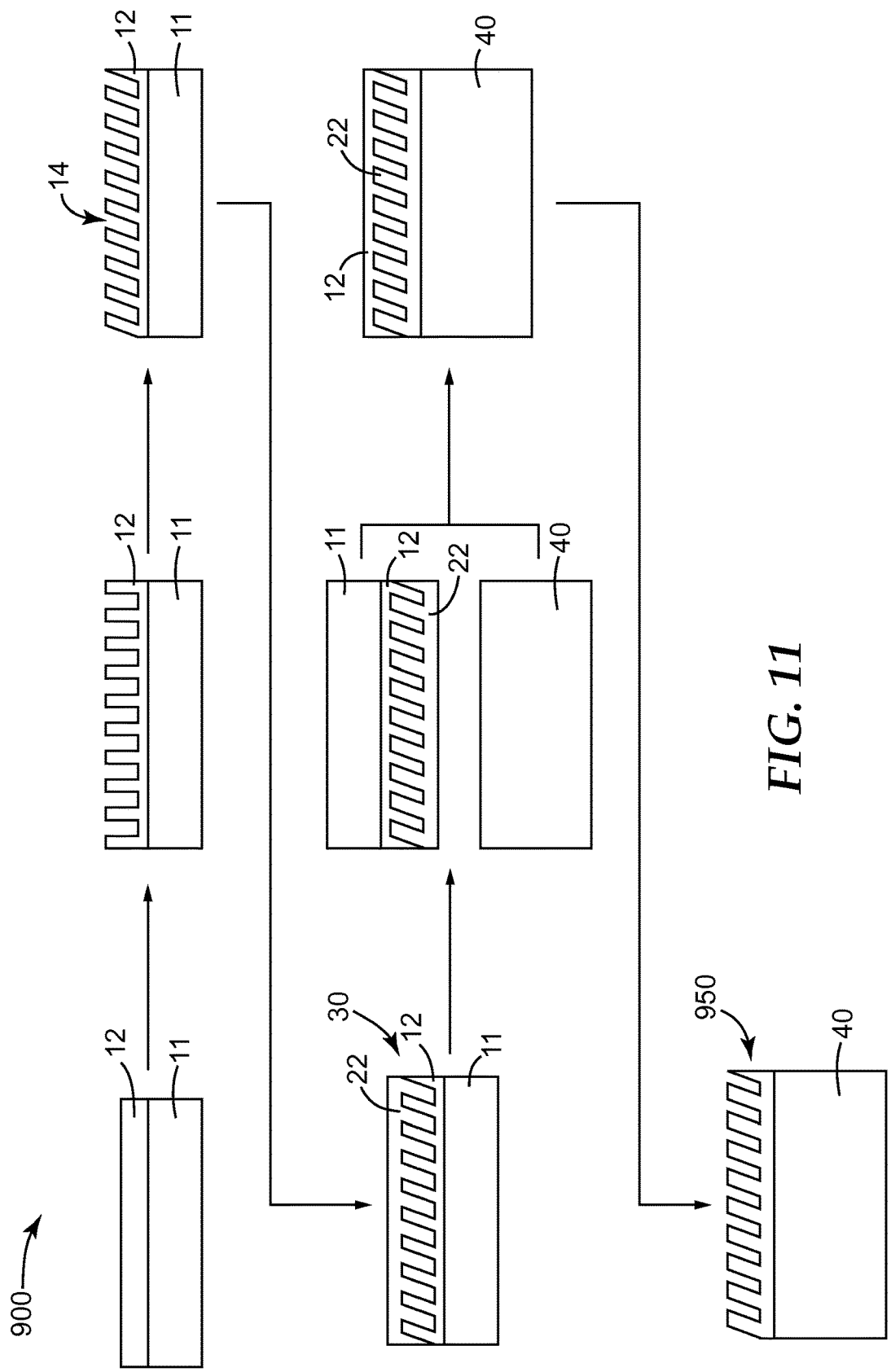
FIG. 11 is a schematic process flow diagram of another illustrative method of forming the transfer film by embossing and deformation and the resulting final reentrant structure.

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

In this disclosure:

"backfill materials" or "backfill layers" refers to layers of materials that fill in irregular or structured surfaces to produce a new surface that may be used as a base to build additional layered elements and is thermally stable;

"bake-out" refers to the process of substantially removing sacrificial material present in a layer by pyrolysis, combustion, sublimation, or vaporization while leaving thermally stable materials substantially intact (backfill, substrate);

"bake-out temperature" refers to the maximum temperature reached during the process of substantially removing sacrificial materials in a layer by pyrolysis or combustion while leaving thermally stable materials substantially intact (backfill, substrate);

"combust" or "combustion" refers to a process of heating a layer that comprises organic materials in an oxidizing atmosphere so that organic materials undergo a chemical reaction with the oxidant;

"nanostructures" refers to features that range from about 1 nm to about 2000 nm in their longest dimension and includes microstructures;

"microstructures" refers to features that range from about 1 micrometer to about 2 mm in their longest dimension;

"pyrolyze" or "pyrolysis" refers to a process of heating a sacrificial layer in an inert atmosphere so that organic materials in the article decompose and create engineered voids;

"structured surface" refers to a surface that includes periodic, quasi-periodic or random engineered microstructures, nanostructures, and/or hierarchical structures that can be in a regular pattern or random across the surface;

"thermally stable" refers to materials that remain substantially intact during the removal of sacrificial materials;

"polysiloxanes" refers to highly branched oligomeric or polymeric organosilicon compounds and may include carbon-carbon and/or carbon-hydrogen bonds while still being considered as inorganic compounds; and "reentrant structure" refers to surface topography that cannot be described by a simple univalued function z=h(x, y), and a vector projected normal to the x-y plane intersects the texture more than once. The terms "reentrant" and "undercut" are synonymous.

Examples of reentrant features are provided in FIG. 1 and FIG. 2A-F along with sample normal vectors 1 that intersect the topography at multiple points 5 to illustrate the definition given. FIG. 1 is an example of a reentrant topographical feature 50 on a substrate 40. The vertical line 1 represents a vector normal to the x-y plane (along the z-axis), and the multiple intersection points 5 that render this feature "reentrant" are marked. FIG. 2A-F are additional examples of reentrant topographical structures 51 (FIG. 2A), 52 (FIG. 2B), 53 (FIG. 2C), 54 (FIG. 2D), 55 (FIG. 2E), 56 (FIG. 2F). The vertical lines 1 are vectors normal to the x-y plane, and the multiple points of intersection that make the surface "reentrant" are marked. The reentrant features described herein can be contiguous, non-contiguous or a combination of the contiguous and non-contiguous features.

A topographical feature does not have to be symmetric to be classified as reentrant. Rather, a structure is considered reentrant provided any radial fraction of an individual feature (or unit cell of a repeating structure) cannot be described by a simple univalued function z=h(x,y). An example of one such reentrant feature is provided as structure of FIG. 2F. A vector normal to the x-y plane intersects the feature multiple times on the right side of the structure, rendering it "reentrant" even though a normal vector does not intersect the feature multiple times on the left side of the structure.

While specific reentrant structures are illustrated in the figures (specifically elliptic paraboloids and segments of spheres), it is understood that the reentrant structure can be any useful reentrant structure, as described above.

Substrates possessing reentrant topographical texture have been used in the preparation of superoleophobic surfaces. "Superoleophobic" surfaces exhibit apparent contact angles above 1500 with organic liquids that have appreciably lower surface tensions than water. Such liquid repellent substrates have also been described in the art as being "omniphobic", "superlyophobic", and "superamphiphobic", and they may find use in applications such as inkjet printing and self-cleaning surfaces.

Liquid droplets exhibiting apparent contact angles above 150 do not always readily slide/roll on substrates due to pinning of the contact line. A common strategy for destabilizing contact line pinning and facilitating drop motion of water droplets is to incorporate multiscale/hierarchical roughness, an approach inspired by the Lotus leaf. Such a hierarchical approach has only been sparingly utilized in superoleophobic applications, likely due to the challenges of fabricating a smaller reentrant texture on top of a larger underlying surface topography. The lamination transfer films and methods described herein enable the fabrication of hierarchical surface topographics in which the outer asperities possess reentrant texture.

The present disclosure relates to lamination transfer films for forming articles with reentrant structures and method of forming these lamination transfer films. These transfer films can be laminated to a desired substrate (like glass) and "baked out" to reveal unique reentrant structures. These baked out reentrant structures are preferably inelastic. While the present disclosure is not so limited, an appreciation of various aspects of the disclosure will be gained through a discussion of the examples provided below.

In many embodiments, a transfer film includes a carrier film, a sacrificial template layer disposed on the carrier film and having reentrant forming template features and a thermally stable backfill layer having a first surface conforming to the reentrant forming template features and forming reentrant features and an opposing planar second surface. A method includes laminating the planar second surface of the transfer film described herein to a receptor substrate, and baking out the sacrificial template layer to form a thermally stable backfill layer having reentrant features. Methods of forming transfer films are also described. These methods generally describe disposing a sacrificial template layer on a carrier film, and forming reentrant forming template features in the sacrificial template layer, and coating a thermally stable backfill material on the sacrificial template layer to form a thermally stable backfill layer. The thermally stable backfill layer has a first surface conforming to the reentrant forming template features and an opposing planar second surface. These features are further illustrated with the figures and described in conjunction with the description below.

The receptor substrates 40 described herein can include glass such as display mother glass (e.g., backplane mother glass), display cover glass, lighting mother glass, architectural glass, roll glass, and flexible glass. An example of flexible roll glass is commercially available under the trade designation WILLOW glass from Corning Incorporated. Other examples of receptor substrates include metals such as metal parts, sheets and foils. Yet other examples of receptor substrates include sapphire, silicon, silica, and silicon carbide. Display backplane mother glass receptor substrates can optionally include a buffer layer on a side of the receptor substrate to which a lamination transfer film is applied. Examples of buffer layers are described in U.S. Pat. No. 6,396,079, which is incorporated herein by reference as if fully set forth. One type of buffer layer is a thin layer of $SiO_2$, as described in K. Kondoh et al., J. of Non-Crystalline Solids 178 (1994) 189-98 and T-K. Kim et al., Mat. Res. Soc. Symp. Proc. Vol. 448 (1997) 419-23, both of which are incorporated herein by reference as if fully set forth.

A particular advantage of the transfer films and methods described herein is the ability to impart reentrant structure to receptor surfaces with large surfaces, such as display mother glass or architectural glass. Semiconductor patterning methods exist for creating micro and nanopatterns that can be complex, however these methods are generally slow, complicated, expensive, and limited to the size of a single wafer (e.g., around 300 mm diameter). Step and repeat stamping methods such as nanoimprint lithography may be used to produce micro and nanopatterns over larger areas than semiconductor patterning methods, however these methods are still generally slow, expensive, and complicated, often requiring several conventional photolithographic process steps such as resist coating, reactive ion etching, and resist stripping.

Continuous replication or molding processes frequently involve the use of a cylindrical tool and a film substrate. The fabrication of reentrant features on a film substrate using a continuous process requires the use of a mechanism to enable the release of the features from the tool. Mechanisms for feature release include the use of elastomeric materials for the tool, the features, or both elements. An alternative to this elastomer method is the use of a sacrificial template as described herein.

Elastomeric elements must deform sufficiently so that the reentrant portion of the features can clear the mold and release from the tool. The deformation imparts significant shear force on the molded features and therefore limits the set of molded materials that can be used in the process to those with relatively high cohesive strength.

In the sacrificial template method described herein, there is no demolding step and therefore no corresponding materials strength requirement for the molded materials. The materials used in the sacrificial template process may include uncured or partially cured materials with little to no cohesive strength. The uncured or partially cured materials undergo a chemical transformation during the bake out step that completes the curing process and develops cohesive strength.

The thermally stable backfill solution can be coated onto the structured surface of the sacrificial layer and any solvent or portion of solvent removed and optionally cured to form the thermally stable backfill layer 22. Preferably, after removal of solvent and curing, the thermally stable material substantially planarizes the sacrificial template layer. Substantial planarization means that the amount of planarization (P %), as defined by Equation 1, is greater than 50%, or greater than 75%, or preferably greater than 90%.

$$P\% = (1-(t_1/h_1))*100 \qquad (1)$$

where $t_1$ is the relief height of a surface layer and $h_1$ is the feature height of features covered by the surface layer, as further disclosed in P. Chiniwalla, *IEEE Trans. Adv. Packaging* 24(1), 2001, 41.

The sacrificial template layer 12 can be on a carrier layer 11 (i.e., liner) having a releasable surface. In other embodiments, a carrier layer 11 is not present. The liner or carrier layer 11 can be implemented with a thermally stable flexible film providing mechanical support for the other layers. The liner 11 has a releasable surface, meaning the liner 11 allows for release of a material applied to the releasable surface. The carrier layer 11 should be thermally stable above 70° C., or alternatively above 120° C., without adversely affecting either the sacrificial layer or the backfill layer. One example of a carrier film is polyethylene terephthalate (PET).

The sacrificial template layer 12 can be structured by any useful method such as a 3C (continuous cast and cure) process or embossed to produce the structured surface 14. In many embodiments a planar first surface opposes the structured second surface 14. The releasable surface of the carrier layer 11 can contact the planar first surface. The sacrificial template layer 12 can be substantially planarized using the backfill layer 22.

As illustrated in the figures, the sacrificial template layer 12 can be cleanly baked out leaving a reentrant structure disposed on the receptor substrate 40. These figures illustrate that the sacrificial template layer 12 is capable of being baked out while leaving a reentrant structure of the thermally stable backfill layer.

The support substrate or carrier layer (described herein) can be embodied as a flexible film providing mechanical support for the other layers. One example of a carrier film is polyethylene terephthalate (PET). Various polymeric film substrates comprised of various thermosetting or thermoplastic polymers are suitable for use as the support substrate. The carrier may be a single layer or multi-layer film. Illustrative examples of polymers that may be employed as the carrier layer film include (1) fluorinated polymers such as poly(chlorotrifluoroethylene), poly(tetrafluoroethylene-cohexafluoropropylene), poly(tetrafluoroethylene-co-perfluoro(alkyl)vinylether), poly(vinylidene fluoride-co-hexafluoropropylene); (2) ionomeric ethylene copolymers poly(ethylene-co-methacrylic acid) with sodium or zinc ions such as SURLYN-8920 Brand and SURLYN-9910 Brand available from E. I. duPont Nemours, Wilmington, Del.; (3) low density polyethylenes such as low density polyethylene; linear low density polyethylene; and very low density polyethylene; plasticized vinyl halide polymers such as plasticized poly(vinychloride); (4) polyethylene copolymers including acid functional polymers such as poly(ethylene-co-acrylic acid) "EAA", poly(ethylene-co-methacrylic acid) "EMA", poly(ethylene-co-maleic acid), and poly(ethylene-co-fumaric acid); acrylic functional polymers such as poly(ethylene-co-alkylacrylates) where the alkyl group is methyl, ethyl, propyl, butyl, et cetera, or CH3(CH2)n- where n is 0 to 12, and poly(ethylene-co-vinylacetate) "EVA"; and (5) (e.g.) aliphatic polyurethanes. The carrier layer can be an olefinic polymeric material, typically comprising at least 50 wt % of an alkylene having 2 to 8 carbon atoms with ethylene and propylene being most commonly employed. Other carrier layers include for example poly(ethylene naphthalate), polycarbonate, poly(meth)acrylate (e.g., polymethyl methacrylate or "PMMA"), polyolefins (e.g., polypropylene or "PP"), polyesters (e.g., polyethylene terephthalate or "PET"), polyamides, polyimides, phenolic resins, cellulose diacetate, cellulose triacetate (TAC), polystyrene, styrene-acrylonitrile copolymers, cyclic olefin copolymers, epoxies, and the like. In some embodiments, the carrier layer can include paper, release-coated paper, non-wovens, wovens (fabric), metal films, and metal foils.

In some embodiments, the carrier layer can include sacrificial materials that can remain on the transfer film during the bake out process. For example, the carrier film can include a PET layer on a PMMA release layer where the release layer remains on the transfer film following release from the PET layer. Sacrificial materials (such as the PMMA release layer), can be pyrolyzed by subjecting them to thermal conditions that can vaporize substantially all of the organic material present in the sacrificial layers. These sacrificial layers can also be subjected to combustion to burn out all of the organic material present in the sacrificial layer. Typically, a clear, high-purity polymer, such as poly(methyl methacrylate), poly(ethyl acrylate-co-methyl methacrylate), can be used as the sacrificial material. Useful sacrificial materials leave very low organic residuals (ash) after pyrolysis or combustion at the bake out temperature.

FIG. 3A is a schematic process flow diagram 100 of an illustrative method of forming the transfer film 30 and resulting final reentrant elliptic paraboloid structure 150. FIG. 3B is an enlargement of the final reentrant elliptic paraboloid structure 150.

The method includes disposing a sacrificial template layer 12 onto the optional carrier layer 11 and forming reentrant forming template features 14 in the sacrificial template layer 12. Then coating a thermally stable backfill material 22 on the sacrificial template layer 12 to from a thermally stable backfill layer 22 having a first surface conforming to the reentrant forming template features 14 and an opposing planar second surface, forming a lamination transfer film 30.

The carrier layer 11 can be removed and the lamination transfer film 30 can be laminated onto the receptor substrate 40. Then the laminated receptor substrate is subjected to an elevated temperature to "bake out" the sacrificial template layer and form the reentrant elliptic paraboloid structure 150 from the thermally stable backfill material 22.

FIG. 4A is a schematic process flow diagram 200 of an illustrative method of forming the transfer film 30 and resulting final reentrant elliptic paraboloid structure 250 with a connecting planar element 252. FIG. 4B is an enlargement of the final reentrant elliptic paraboloid structure 250 with a connecting planar element 252.

The method includes disposing a sacrificial template layer 12 onto the optional carrier layer 11 and forming reentrant forming template features 14 in the sacrificial template layer 12. Then coating a thermally stable backfill material 22 on the sacrificial template layer 12 to form a thermally stable backfill layer 22 having a first surface conforming to the reentrant forming template features 14 and an opposing planar second surface, forming a lamination transfer film 30. A layer of "land" material (thermally stable backfill material 22) covers the sacrificial template layer 12.

The carrier layer 11 can be removed and the lamination transfer film 30 can be laminated onto the receptor substrate 40. Then the laminated receptor substrate is subjected to an elevated temperature to "bake out" the sacrificial template layer and form the reentrant elliptic paraboloid structure 250 with a connecting planar element 252 from the thermally stable backfill material 22.

FIG. 5A is a schematic process flow diagram 300 of an illustrative method of forming the transfer film 30 and resulting final reentrant elliptic paraboloid structure 350 embedded in a layer 352 with a different index of refraction. FIG. 5B is an enlargement of the final reentrant elliptic paraboloid structure 350 embedded in a layer 352 with a different index of refraction. In some instances the elliptic paraboloid structure 350 may have a higher index than layer 352 or in some instances the elliptic paraboloid structure 350 may have a lower index than layer 352.

The method includes disposing a sacrificial template layer 12 onto the optional carrier layer 11. The sacrificial template layer 12 can include a low index forming material 16 and forming reentrant forming template features 14 in the sacrificial template layer 12. Then coating a thermally stable backfill material 22 on the sacrificial template layer 12 to form a thermally stable backfill material 22 having a first surface conforming to the reentrant forming template features 14 and an opposing planar second surface, forming a lamination transfer film 30.

The carrier layer 11 can be removed and the lamination transfer film 30 can be laminated onto the receptor substrate 40. Then the laminated receptor substrate is subjected to an elevated temperature to "bake out" the sacrificial template layer leaving the material 352 with a different or second index of refraction and the reentrant elliptic paraboloid structure 350 embedded within the material 352.

In some embodiments the sacrificial template layer 12 includes the thermally stable molecular species and/or inorganic materials such as, for example, inorganic nanomaterials. The inorganic nanomaterials can be present in a sacrificial layer 12 and the sacrificial material can be cleanly baked out leaving a densified layer of nanomaterials. In some embodiments, the densified layer of nanomaterials can completely or partially fuse into a glass-like material. The densified layer of nanomaterials can have substantial void volume. The densified layer of nanomaterials can be transparent and can have a high index of refraction compared to surrounding layers of the disclosed transfer films. Inorganic nanoparticles can be present in one or more embedded layers, each layer having a different index of refraction influenced by the type and concentration of nanoparticles present in the layer.

FIG. 6A is a schematic process flow diagram 400 of another illustrative method of forming the transfer film 30 and resulting final reentrant elliptic paraboloid structure 450. FIG. 6B is an enlargement of the final reentrant elliptic paraboloid structure 450.

The method includes disposing a first layer 17 including thermally stable material dispersed in sacrificial material and disposing a sacrificial template layer 12 onto the first layer 17 and forming reentrant forming template features 14 in the sacrificial template layer 12. Then coating a thermally stable backfill material 22 on the sacrificial template layer 12 to form a thermally stable backfill material 22 having a first surface conforming to the reentrant forming template features 14 and an opposing planar second surface, forming a lamination transfer film 30.

The carrier layer 11 can be removed and the lamination transfer film 30 can be laminated onto the receptor substrate 40. Then the laminated receptor substrate is subjected to an elevated temperature to "bake out" the sacrificial template layer and form the reentrant elliptic paraboloid structure 450 with a connecting planar element 452 from the thermally stable backfill material 22.

In some embodiments the sacrificial template layer 12 includes the thermally stable molecular species and/or inorganic materials such as, for example, inorganic nanomaterials. The inorganic nanomaterials can be present in a sacrificial layer 12 and the sacrificial material can be cleanly baked out leaving a densified layer of nanomaterials. In some embodiments, the densified layer of nanomaterials can completely or partially fuse into a glass-like material. The densified layer of nanomaterials can have substantial void volume. The densified layer of nanomaterials can be transparent and can have a high index of refraction compared to surrounding layers of the disclosed transfer films. Inorganic nanoparticles can be present in one or more embedded layers, each layer having a different index of refraction influenced by the type and concentration of nanoparticles present in the layer.

FIG. 7A is a schematic process flow diagram 500 of another illustrative method of forming the transfer film 30 and resulting final reentrant elliptic paraboloid structure 550 with a connecting planar element 552. FIG. 7B is an enlargement of the final reentrant elliptic paraboloid structure 550 with a connecting planar element 552.

The method includes disposing a thermally stable backfill material 22 onto the optional carrier layer 11 and forming reentrant forming template features 14 in the thermally stable backfill material 22. Then coating a sacrificial template layer 12 on the thermally stable backfill material 22 to form a thermally stable backfill material 22 having a first surface conforming to the reentrant forming template features 14 and an opposing planar second surface, forming a lamination transfer film 30. A layer of "land" material (thermally stable backfill material 22) covers the carrier layer 11.

The carrier layer 11 can be removed and the lamination transfer film 30 can be laminated onto the receptor substrate 40. Then the laminated receptor substrate is subjected to an elevated temperature to "bake out" the sacrificial template layer and form the reentrant elliptic paraboloid structure 550 with a connecting planar element 552 from the thermally stable backfill material 22.

FIG. 8A is a schematic process flow diagram 600 of another illustrative method of forming the transfer film 30 and resulting final reentrant paraboloid structure 650. FIG. 8B is an enlargement of the final reentrant elliptic paraboloid structure 650.

The method includes disposing a sacrificial layer 12 onto the optional carrier layer 11 and then forming reentrant forming template features 14 with thermally stable backfill material 22. Then coating a layer 17 including thermally stable material dispersed in sacrificial material on the thermally stable backfill material 22 having a first surface conforming to the reentrant forming template features 14 and an opposing planar second surface, forming a lamination transfer film 30.

The carrier layer 11 can be removed and the lamination transfer film 30 can be laminated onto the receptor substrate 40. Then the laminated receptor substrate is subjected to an elevated temperature to "bake out" the sacrificial template layer and form the reentrant elliptic paraboloid structure 650 with a connecting planar element 652 from the thermally stable material in coating layer 17.

In some embodiments the sacrificial template layer 12 includes the thermally stable molecular species and/or inorganic materials such as, for example, inorganic nanomaterials. The inorganic nanomaterials can be present in a sacrificial layer 12 and the sacrificial material can be cleanly baked out leaving a densified layer of nanomaterials. In some embodiments, the densified layer of nanomaterials can completely or partially fuse into a glass-like material. The densified layer of nanomaterials can have substantial void volume. The densified layer of nanomaterials can be transparent and can have a high index of refraction compared to surrounding layers of the disclosed transfer films. Inorganic nanoparticles can be present in one or more embedded layers, each layer having a different index of refraction influenced by the type and concentration of nanoparticles present in the layer.

FIG. 9A is a schematic process flow diagram 700 of another illustrative method of forming the transfer film 30 by etching and the resulting final reentrant structure 750. FIG. 9B is an enlargement of the final reentrant structure 750.

The method includes disposing a sacrificial template layer 12 onto the optional carrier layer 11 and forming sacrificial mask 70 having a plurality of openings or vias 72 on the sacrificial template layer 12. Then the construction is subjected to an etch to form reentrant forming template features 14 in the sacrificial template layer 12. The materials for the sacrificial mask 72 and the sacrificial template layer 12 are selected so that they etch at different rates. Thermally stable backfill material 22 is then coated on the sacrificial template layer 12 to form a thermally stable backfill layer 22 having a first surface conforming to the reentrant forming template features 14 and an opposing planar second surface, forming a lamination transfer film 30.

Sacrificial photoresists (utilized for the sacrificial mask 70) are materials that can be photopatterned using conventional photolithographic methods (such as photoexposure through a photomask) and developed using a solvent wash or selective thermal decomposition. In addition, sacrificial photoresists can be cleanly removed during a final high temperature bake out step. Examples of positive tone sacrificial photoresists have been described by Chen and Kohl (Y.-C. Chen, P. A. Kohl, Microelectronic Eng. 88, 2011, 3087). Examples of negative tone sacrificial photoresists have been described by Wu, et al. (X. Wu, et al., J. Appl. Poly. Sci. 88, 2003, 1186).

The carrier layer 11 can be removed and the lamination transfer film 30 can be laminated onto the receptor substrate 40. Then the laminated receptor substrate is subjected to an elevated temperature to "bake out" the sacrificial template layer 12 and the sacrificial mask 70 and form the reentrant structure 750 from the thermally stable backfill material 22.

FIG. 10A is a schematic process flow diagram 800 of another illustrative method of forming the transfer film 30 by etching and the resulting final reentrant structure 850 with hierarchical structure 852. FIG. 10B is an enlargement of the reentrant template structure with hierarchical structure of FIG. 10A. FIG. 10C is an enlargement of the final reentrant structure 850 with hierarchical structure of FIG. 10A

The method includes disposing a sacrificial template layer 12 onto the optional carrier layer 11. The sacrificial template layer 12 includes particles 13 to form nano or micro structure within the subsequently formed reentrant forming template features. The method then includes forming a sacrificial mask 70 having a plurality of openings or vias 72 on the sacrificial template layer 12.

Then the construction is subjected to an etch to form reentrant forming template features 14 in the sacrificial template layer 12 and exposing the particles 13. Thermally stable backfill material 22 is then coated on the sacrificial template layer 12 to form a thermally stable backfill layer 22 having a first surface conforming to the reentrant forming template features 14 and nano or micro structure 13 and an opposing planar second surface, forming a lamination transfer film 30.

The carrier layer 11 can be removed and the lamination transfer film 30 can be laminated onto the receptor substrate 40. Then the laminated receptor substrate is subjected to an elevated temperature to "bake out" the sacrificial template layer 12 and the sacrificial mask 70 (and any other remaining sacrificial material) and form the reentrant structure 850 with hierarchical structure 852 from the thermally stable backfill material 22.

Examples of sacrificial particles 13 include acrylic particles. Some of these particles may be lightly crosslinked. Alternatively, the particles are not crosslinked, and are washed away using a solvent wash. Preferable acrylic particles include crosslinked polymethyl methacrylate (PMMA) beads available from Soken Chemical America of Fayetteville, Ga., under the trade designations MX2000, MX80H3WT, and MX180. Also, SPHEROMERS CA and CACHE CA (available from Microbeads, Inc, Skedsmokorset, Norway) are mono-sized cross-linked PMMA beads that can have various degrees of crosslinking, which will affect the sacrificial nature of the beads. Less preferable are SPHEROMERS CS and CALIBRE CS (also available from Microbeads, Skedsmokorset, Norway) which are the brand names for monosized cross-linked polystyrene (PS) beads. They are available in various sizes from 1 to 160 micrometers. Examples of thermally stable particles or beads include silicone resin particles, which are sometimes called polymethylsilsesquioxane beads. Exemplary silicone resin particles include those available from Momentive Performance Materials of Columbus, Ohio, under the trade designation "TOSPEARL" such as, for example, TOSPEARL 120, TOSPEARL 120A, TOSPEARL 130, TOSPEARL 130A, TOSPEARL 145, TOSPEARL 145 A, TOSPEARL 240, TOSPEARL 3120, TOSPEARL 200013, TOSPEARL 3000A, TOSPEARL 111 OA. Examples of thermally stable textured beads include silicone resin particles ACEMATT OK607 (commercially available from Evonik, Parsippany, N.J.), which is 4.5 micron silica porous bead, or SUNSIL-20, commercially available from SUNJIN CHEMICAL CO., LTD. Kyungki, Korea) which is a 2 micron size porous silica bead. "Fumed" nanoparticles, such as silica and alumina, with primary size less than about 50 nm, may also be used as a thermally stable texturing agent in combination with the above thermally stable beads or they may be used alone. Exemplary materials include CAB-OSPERSE PG 002 fumed silica, CAB-O-SPERSE 2017A fumed silica, and CAB-OSPERSE PG 003 fumed alumina, available from Cabot Co. Boston, Mass.

FIG. 11 is a schematic process flow diagram 900 of another illustrative method of forming the transfer film 30 by embossing and deformation and the resulting final reentrant structure 950. The method includes disposing a sacrificial template layer 12 onto the optional carrier layer 11 and forming reentrant forming template features 14 in the sacrificial template layer 12 by embossing and then mechanically or thermally deforming the features, for example. Then coating a thermally stable backfill material 22 on the sacrificial template layer 12 to form a thermally stable backfill layer 22 having a first surface conforming to the reentrant forming template features 14 and an opposing planar second surface, forming a lamination transfer film 30.

The carrier layer 11 can be removed and the lamination transfer film 30 can be laminated onto the receptor substrate 40. Then the laminated receptor substrate is subjected to an elevated temperature to "bake out" the sacrificial template layer and form the reentrant structure 950 from the thermally stable backfill material 22.

Figures 12A, 12B:
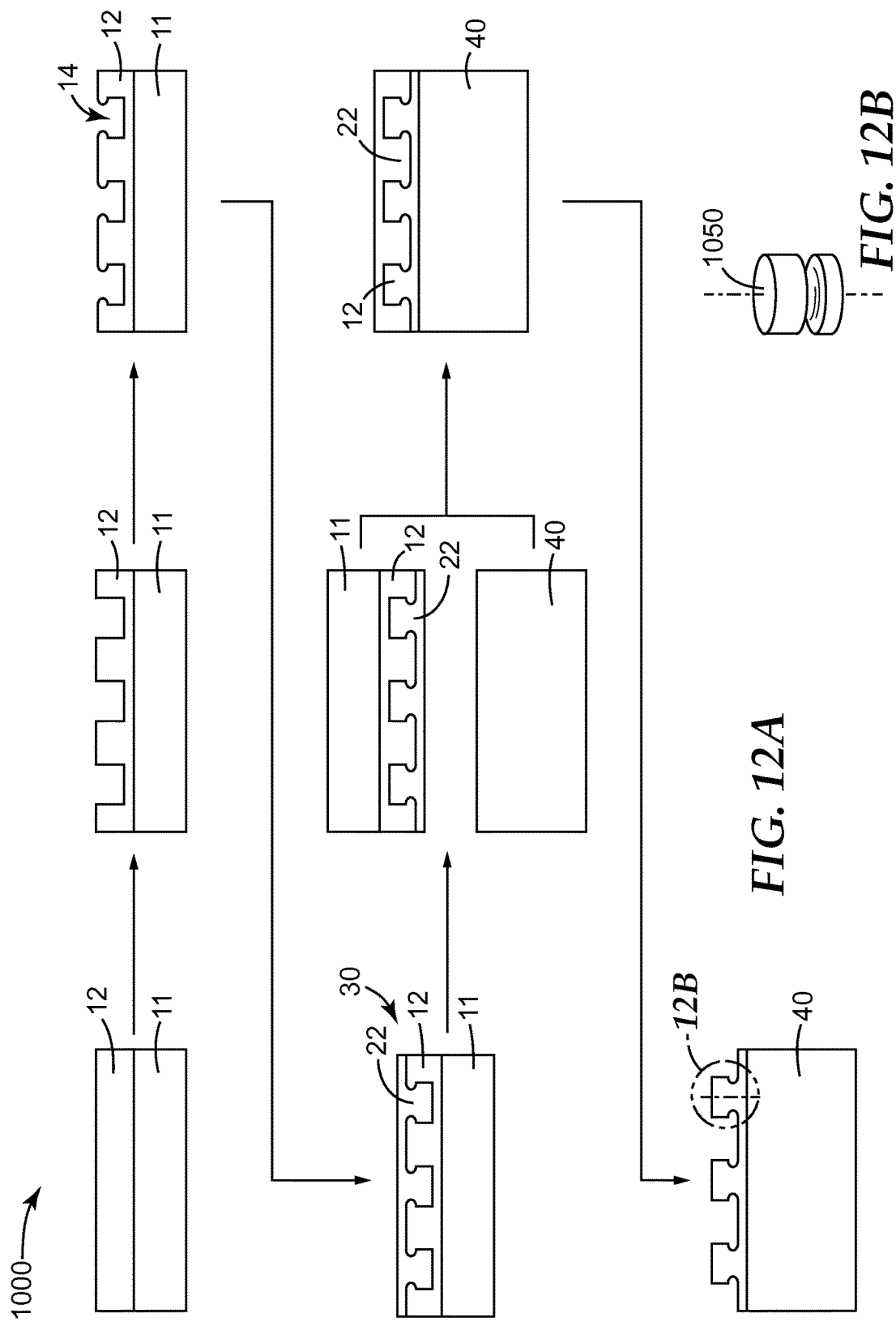
FIG. 12A is a schematic process flow diagram of another illustrative method of forming the transfer film by embossing and deformation and the resulting final reentrant structure.
FIG. 12B is an enlargement of the final reentrant structure of FIG. 12A.

FIG. 12A is a schematic process flow diagram 1000 of another illustrative method of forming the transfer film 30 by for example embossing and deformation and the resulting final reentrant structure 1050. FIG. 12B is an enlargement of the final reentrant structure 1050.

The method includes disposing a sacrificial template layer 12 onto the optional carrier layer 11 and forming reentrant forming template features 14 in the sacrificial template layer 12 by embossing and then mechanically or thermally deforming the features, for example. Then coating a thermally stable backfill material 22 on the sacrificial template layer 12 to form a thermally stable backfill layer 22 having a first surface conforming to the reentrant forming template features 14 and an opposing planar second surface, forming a lamination transfer film 30. In this figure, the reentrant forming template features 14 are noncontiguous.

The carrier layer 11 can be removed and the lamination transfer film 30 can be laminated onto the receptor substrate 40. Then the laminated receptor substrate is subjected to an elevated temperature to "bake out" the sacrificial template layer and form the reentrant structure 1050 from the thermally stable backfill material 22.

FIG. 13 is a schematic process flow diagram 1100 of another illustrative method of forming the transfer film 30 by for example embossing and deformation and the resulting final reentrant structure 1150. FIG. 13B is an enlargement of the final reentrant structure 1150.

The method includes disposing a sacrificial template layer 12 onto the optional carrier layer 11 and forming reentrant forming template features 14 in the sacrificial template layer 12 by embossing and then mechanically or thermally deforming the features, for example. Then coating a thermally stable backfill material 22 on the sacrificial template layer 12 to form a thermally stable backfill layer 22 having a first surface conforming to the reentrant forming template features 14 and an opposing planar second surface, forming a lamination transfer film 30. In this figure, the reentrant forming template features 14 are contiguous.

The carrier layer 11 can be removed and the lamination transfer film 30 can be laminated onto the receptor substrate 40. Then the laminated receptor substrate is subjected to an elevated temperature to "bake out" the sacrificial template layer and form the reentrant structure 1150 from the thermally stable backfill material 22.

FIG. 14A is a schematic process flow diagram 1200 of another illustrative method of forming the transfer film 30 by etching and the resulting final reentrant structure 1250 with hierarchical structure 1252. FIG. 14B is an enlargement of the final reentrant structure 1250.

The method includes disposing a sacrificial structured surface layer 18 onto the carrier layer 1 and disposing a sacrificial template layer 12 onto the sacrificial structured surface layer 18. The sacrificial structured surface layer 18 form nano or micro structure within the subsequently formed reentrant forming template features 14. The method then includes forming a sacrificial mask 70 having a plurality of opening or vias 72 on the sacrificial template layer 12. Then the construction is subjected to an etch to form reentrant forming template features 14 in the sacrificial template layer 12. The materials for the sacrificial mask 72 and the sacrificial template layer 12 are selected so that they etch at different rates. Thermally stable backfill material 22 is then coated on the sacrificial template layer 12 to form a thermally stable backfill layer 22 having a first surface conforming to the reentrant forming template features 14 and sacrificial structured surface layer 18 and an opposing planar second surface, forming a lamination transfer film 30. The sacrificial structured surface layer 18 and the sacrificial mask 70 can be formed of the same materials, as desired.

The carrier layer 11 can be removed and the lamination transfer film 30 can be laminated onto the receptor substrate 40. Then the laminated receptor substrate is subjected to an elevated temperature to "bake out" the sacrificial template layer 12 and the sacrificial mask 70 (and any other remaining sacrificial material) and form the reentrant hierarchical structure 1250 with surface structure 1252 from the thermally stable backfill material 22.

FIG. 15A is a schematic process flow diagram 1300 of another illustrative method of forming the transfer film 30 and resulting final reentrant hole 1350 of a sphere segment structure. FIG. 15B is an enlargement of the reentrant template structure without hierarchical structure of FIG. 15A. FIG. 15C is an enlargement of the reentrant template structure with hierarchical structure of FIG. 15A. FIG. 15D is an enlargement of the reentrant structure without hierarchical structure of FIG. 15A.

The method includes disposing sacrificial template beads 12 and forming reentrant forming template features 14 by partially embedding sacrificial beads 12 in the carrier film 11. Then coating a thermally stable backfill material 22 on the sacrificial template heads 12 to form a thermally stable back fill layer 22 having a first surface conforming to the reentrant forming template features 14 and an opposing planar second surface, forming a lamination transfer film 30.

The carrier layer 11 can be removed, exposing a portion of the sacrificial beads 12. The lamination transfer film 30 can be laminated onto the receptor substrate 40. Then the laminated receptor substrate is subjected to an elevated temperature to "bake out" the sacrificial template layer and form the reentrant spheroid or segment of a sphere structure 1350 from the thermally stable backfill material 22.

Examples of sacrificial beads 12 include acrylic particles. Some of these particles may be lightly crosslinked. Alternatively, the particles are not crosslinked, and are washed away using a solvent wash. Preferable acrylic particles include crosslinked polymethyl methacrylate (PMMA) beads available from Soken Chemical America of Fayetteville, Ga., under the trade designations MX2000, MX80H3WT, and MX180. Also, SPHEROMERS CA and CACHE CA (available from Microbeads, Inc, Skedsmokorset, Norway) are mono-sized cross-linked PMMA beads that can have various degrees of crosslinking, which will affect the sacrificial nature of the beads. Less preferable are SPHEROMERS CS and CALIBRE CS (also available from Microbeads, Skedsmokorset, Norway) which are the brand names for monosized cross-linked polystyrene (PS) beads. They are available in various sizes from 1 to 160 micrometers.

Alternatively, the sacrificial beads 12 may be roughened by physical, chemical, or physico-chemical roughening methods. Physical roughening methods may include reactive ion etching the beads in an oxygen plasma or milling the beads in a ball mill using grinding media that is harder than the sacrificial beads. Examples of chemical roughening method may include etching pits in the particles via exposure to acids or bases in liquid or vaporized form. Other physico-chemical processes may include swelling the crosslinked polymer in a good solvent, followed by a rapid drying process to lock in roughened nanostructure.

Figure 16:
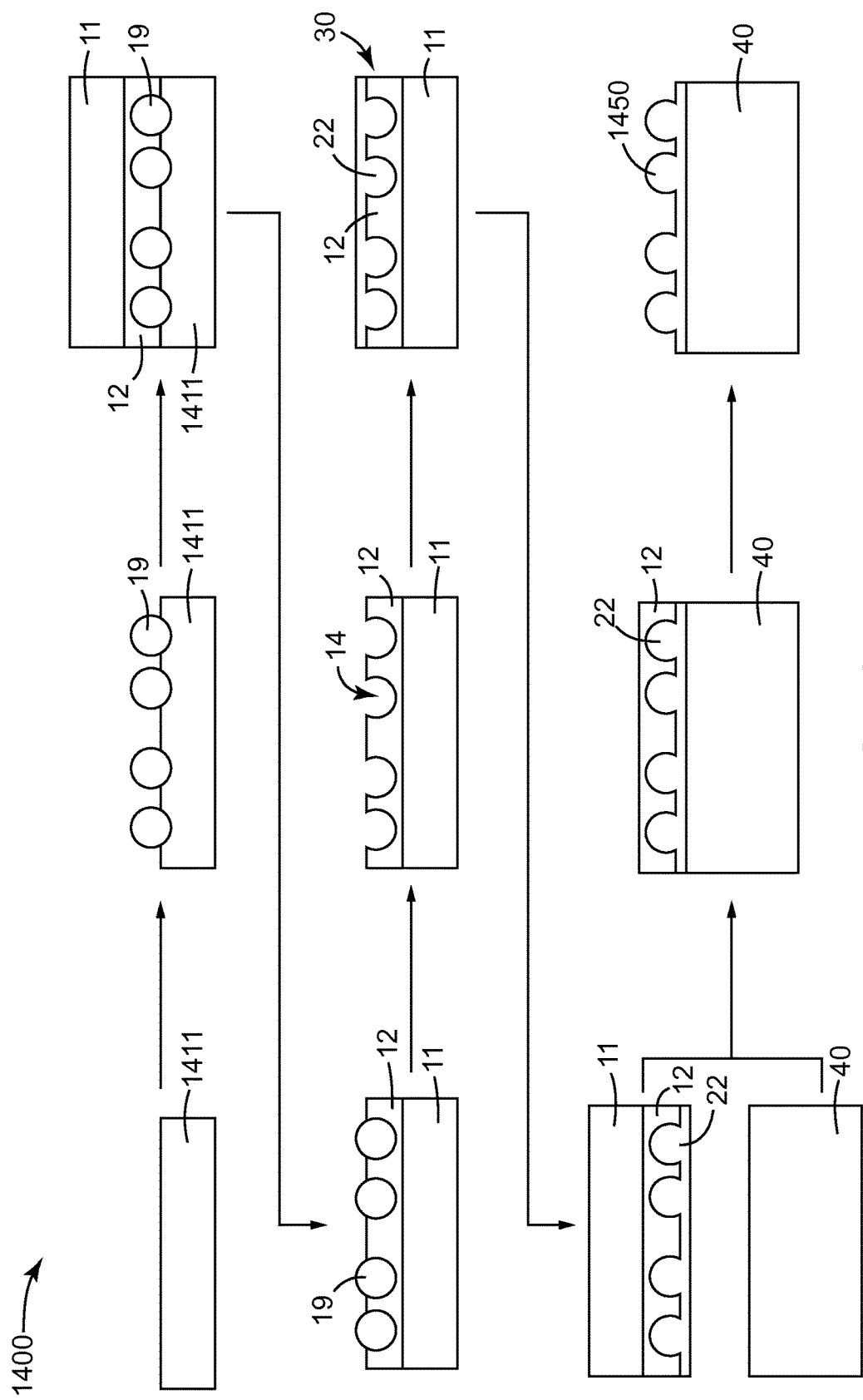
FIG. 16 is a schematic process flow diagram of another illustrative method of forming the transfer film and resulting final reentrant protruding segment of a sphere structure.

FIG. 16 is a schematic process flow diagram 1400 of another illustrative method of forming the transfer film 30 and resulting final reentrant protruding segment 1450 of a sphere structure. The method includes disposing beads 19 onto the carrier layer 1411 and coating a sacrificial template layer 12 onto the beads 19 and forming reentrant forming template features 14 in the sacrificial template layer 12 by removing (for example, dissolving) the beads 19 from the sacrificial template layer 12. Then coating a thermally stable backfill material 22 on the sacrificial template layer 12 to form a thermally stable backfill layer 22 having a first surface conforming to the reentrant forming template features 14 and an opposing planar second surface, forming a lamination transfer film 30. The sacrificial beads 19 may be roughened by physical, chemical, or physico-chemical roughening methods as disclosed above.

The carrier layer 11 can be removed and the lamination transfer film 30 can be laminated onto the receptor substrate 40. Then the laminated receptor substrate is subjected to an elevated temperature to "bake out" the sacrificial template layer and form the reentrant spheroid or segment of a sphere structure 1450 from the thermally stable backfill material 22.

Thermally Stable Material

A thermally stable material is utilized to form the thermally stable backfill layer of the transfer tape. The thermally stable material includes thermally stable molecular species. It is understood that the thermally stable material and the thermally stable molecular species includes precursor materials that either are or transform into materials that remain substantially intact during the removal of sacrificial materials, such as during "bake out" or pyrolysis.

In some embodiments the sacrificial template layer 12 includes the thermally stable molecular species and/or inorganic materials such as, for example, inorganic nanomaterials. The inorganic nanomaterials can be present in a sacrificial layer 12 and the sacrificial material can be cleanly baked out leaving a densified layer of nanomaterials. In some embodiments, the densified layer of nanomaterials can completely or partially fuse into a glass-like material. The densified layer of nanomaterials can have substantial void volume. The densified layer of nanomaterials can be transparent and can have a high index of refraction compared to surrounding layers of the disclosed transfer films. Inorganic nanoparticles can be present in one or more embedded layers, each layer having a different index of refraction influenced by the type and concentration of nanoparticles present in the layer.

Materials that may be used for the backfill include polysiloxane resins, polysilazanes, polyimides, silsesquioxanes of bridge or ladder-type, silicones, and silicone hybrid materials and many others. Exemplary polysiloxane resins are available under the trade designation PERMANEW 6000, available from California Hardcoating Company, Chula Vista, Calif. These molecules typically have an inorganic component which leads to high dimensional stability, mechanical strength, and chemical resistance, and an organic component that helps with solubility and reactivity.

In many embodiments the thermally stable molecular species includes silicon, hafnium, strontium, titanium or zirconium. In some embodiments the thermally stable molecular species includes a metal, metal oxide or metal oxide precursor. Metal oxide precursors may be used in order to act as an amorphous "binder" for inorganic nanoparticles, or they may be used alone.

In many embodiments, the materials useful in the current invention belong to a class of the highly branched organosilicon oligomers and polymers of a general formula (as below) which can be further reacted to form crosslinked networks by homo-condensation of Si—OH groups, heterocondensation with the remaining hydrolyzable groups (e.g. alkoxy), and/or by reactions of the functional organic groups (e.g. ethylenically unsaturated). This class of materials is derived primarily from organosilanes of a general formula:

$$R_xSiZ_{1-x},$$

wherein

R is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_1$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these.

Z is a hydrolyzable group, such as halogen (containing the elements F, Br, Cl, or I), $C_1$-$C_{20}$ alkoxy, $C_5$-$C_{20}$ aryloxy, and/or combinations of these.

The majority of the composition may consist of $RSiO_{3/2}$ units thus the class of materials is often called silsesquioxanes (or T-resins), however they may also contain mono- ($R_3Si$—$O_{1/2}$), di-($R_2SiO_{2/2}$) and tetrafunctional groups ($Si$—$O_{4/2}$). Organically-modified disilanes of the formula:

$$Z_{3-a}R_aSi\text{—}Y\text{—}Si\ R_nZ_{3-n}$$

are often used in the hydrolyzable compositions to further modify the properties of the materials (to form the so-called bridged silsesquioxanes), the R and Z groups are defined above. The materials can be further formulated and reacted with metal alkoxides ($M(OR)_m$) to form metallo-silsesquioxanes.

In many embodiments the highly branched organosilicon oligomers and polymers of a general formula:

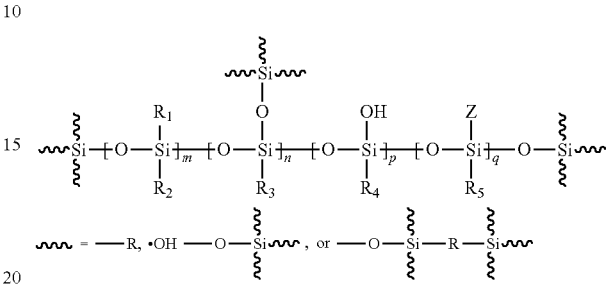

$R_1$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_2$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_1$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_3$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_4$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_6$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_5$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

Z is a hydrolyzable group, such as halogen (containing the elements F, Br, Cl, or I), $C_1$-$C_{20}$ alkoxy, C—$C_{20}$ aryloxy, and/or combinations of these.

m is an integer from 0 to 500;
n is an integer from 1 to 500;
p is an integer from 0 to 500;
q is an integer from 0 to 100.

As used herein, the term "substituted" refers to one substituted with at least a substituent selected from the group consisting of a halogen (containing the elements F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, alkyl group, a $C_2$ to $C_{20}$ alkenyl group, a $C_2$ to $C_{20}$ alkynyl group, $C_6$ to $C_{30}$ aryl group, a $C_7$ to $C_{13}$ arylalkyl group, a $C_1$ to $C_4$ oxyalkyl group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a heterocycloalkyl group, and a combination thereof, instead of hydrogen of a compound.

The resulting highly branched organosilicon polymer has a molecular weight in a range from 150 to 300,000 Da or preferably in a range from 150 to 30,000 Da.

Preferably, the thermally stable backfill contains the reaction product of the hydrolysis and condensation of a methyltriethoxysilane precursor in a polar solvent. After synthesis, the resulting polymer preferably has a molecular weight of nominally less than 30,000 Da. The thermally stable backfill solution also preferably includes less than fifty percent by weight silica nanoparticles nominally of a size between 10-50 nanometers.

The thermally stable compositions described herein preferably comprise inorganic nanoparticles. These nanoparticles can be of various sizes and shapes. The nanoparticles can have an average particle diameter less than about 1000 nm, less than about 100 nm, less than about 50 nm, or less than about 35 nm. The nanoparticles can have an average particle diameter from about 3 nm to about 50 nm, or from about 3 nm to about 35 nm, or from about 5 nm to about 25 nm. If the nanoparticles are aggregated, the maximum cross sectional dimension of the aggregated particle can be within any of these ranges, and can also be greater than about 100 nm. "Fumed" nanoparticles, such as silica and alumina, with primary size less than about 50 nm, may also be used, such as CAB-OSPERSE PG 002 fumed silica, CAB-O-SPERSE 2017A fumed silica, and CAB-OSPERSE PG 003 fumed alumina, available from Cabot Co. Boston, Mass. Their measurements can be based on transmission electron microscopy (TEM). Nanoparticles can be substantially fully condensed. Fully condensed nanoparticles, such as the colloidal silicas, typically have substantially no hydroxyls in their interiors. Non-silica containing fully condensed nanoparticles typically have a degree of crystallinity (measured as isolated particles) greater than 55%, preferably greater than 60%, and more preferably greater than 70%. For example, the degree of crystallinity can range up to about 86% or greater. The degree of crystallinity can be determined by X-ray diffraction techniques. Condensed crystalline (e.g. zirconia) nanoparticles have a high refractive index whereas amorphous nanoparticles typically have a lower refractive index. Various shapes of the inorganic or organic nanoparticles may be used, such as sphere, rod, sheet, tube, wire, cube, cone, tetrahedron, and the like.

The size of the particles is generally chosen to avoid significant visible light scattering in the final article. The nanomaterial selected can impart various optical properties (i.e. refractive index, birefringence), electrical properties (e.g. conductivity), mechanical properties (e.g. toughness, pencil hardness, scratch resistance) or a combination of these properties. It may be desirable to use a mix of organic and inorganic oxide particle types to optimize an optical or material property and to lower total composition cost.

Examples of suitable inorganic nanoparticles include metal nanoparticles or their respective oxides, including the elements zirconium (Zr), titanium (Ti), hafnium (Hf), aluminum (Al), iron (Fe), vanadium (V), antimony (Sb), tin (Sn), gold (Au), copper (Cu), gallium (Ga), indium (In), chromium (Cr), manganese (Mn), cobalt (Co), nickel (Ni), zinc (Zn), yttrium (Y), niobium (Nb), molybdenum (Mo), technetium (Te), ruthenium (Ru), rhodium (Rh), palladium (Pd), silver (Ag), cadmium (Cd), lanthanum (La), tantalum (Ta), tungsten (W), rhenium (Rh), osmium (Os), iridium (Ir), platinum (Pt), and any combinations thereof.

In a preferred embodiment, nanoparticles of zirconium oxide (zirconia) are used. Zirconia nanoparticles can have a particle size from approximately 5 nm to 50 nm, or 5 nm to 15 nm, or 10 nm. Zirconia nanoparticles can be present in the durable article or optical element in an amount from 10 to 70 w %/o, or 30 to 50 wt %. Zirconias for use in materials of the invention are commercially available from Nalco Chemical Co. (Naperville, Ill.) under the product designation NALCO OOSSOO8 and from Buhler AG Uzwil, 20 Switzerland under the trade designation "Buhler zirconia Z-WO sol". Zirconia nanoparticle can also be prepared such as described in U.S. Pat. No. 7,241,437 (Davidson et al.) and U.S. Pat. No. 6,376,590 (Kolb et al.). Titania, antimony oxides, alumina, tin oxides, and/or mixed metal oxide nanoparticles can be present in the durable article or optical element in an amount from 10 to 70 wt %, or 30 to 50 wt %. Densified ceramic oxide layers may be formed via a "sol-gel" process, in which ceramic oxide particles are incorporated into a gelled dispersion with a precursor of at least one modifying component followed by dehydration and firing, as described in U.S. Pat. No. 5,453,104 (Schwabel). Mixed metal oxide for use in materials of the invention are commercially available from Catalysts & Chemical Industries Corp., (Kawasaki, Japan) under the product designation OPTOLAKE.

Other examples of suitable inorganic nanoparticles include elements and alloys known as semiconductors and their respective oxides such as silicon (Si), germanium (Ge), silicon carbide (SiC), silicon germanide (SiGe), aluminium nitride (AlN), aluminium phosphide (AlP), boron nitride (BN), boron carbide ($B_4C$), gallium antimonide (GaSb), indium phosphide (InP), gallium arsenide nitride (GaAsN), gallium arsenide phosphide (GaAsP), indium aluminum arsenide nitride (InAlAsN), zinc oxide (ZnO), zinc selenide (ZnSe), zinc sulfide (ZnS), zinc telluride (ZnTe), mercury zinc selenide (HgZnSe), lead sulfide (PbS), lead telluride (PbTe), tin sulfide (SnS), lead tin telluride (PbSnTe), thallium tin telluride ($Tl_2SnTe_5$), zinc phosphide ($Zn_3P_2$), zinc arsenide ($Zn_3As_2$), zinc antimonide ($Zn_3Sb_2$), lead(II) iodide ($PbI_2$), copper(I) oxide ($Cu_2O$).

Silicon dioxide (silica) nanoparticles can have a particle size from 5 nm to 75 nm or 10 nm to 30 nm or 20 nm. Silica nanoparticles are typically in an amount from 10 to 60 wt.-%. Typically the amount of silica is less than 40 wt %. Suitable silicas are commercially available from Nalco Chemical Co. (Naperville, Ill.) under the trade designation NALCO COLLOIDAL SILICAS. For example, silicas 10 include NALCO trade designations 1040, 1042, 1050, 1060, 2327 and 2329, the organosilica under the product name IPA-ST-MS, IPA-ST-L, IPA-ST, IPA-ST-UP, MA-ST-M, and MAST sols from Nissan Chemical America Co. Houston, Tex. and the SNOWTEX ST-40, ST-50, ST-20L, ST-C, ST-N, ST-O, ST-OL, ST-ZL, ST-UP, and ST-OUP, also from Nissan Chemical America Co. Houston, Tex. Suitable fumed silicas include for example, products sold under the tradename, AEROSIL series OX-50, -130, -150, and -200 available from DeGussa AG, (Hanau, Germany), and CAB-O-SPERSE 2095, CAB-O-SPERSE A105, CAB-O-SIL M5 available from Cabot Corp. (Tuscola, Ill.). The weight ratio of polymerizable material to nanoparticles can range from about 30:70, 40:60, 50:50, 55:45, 60:40, 70:30, 80:20 or 90:10 or more. The preferred ranges of weight percent of nanoparticles range from about 10 wt % to about 60% by weight, and can depend on the density and size of the nanoparticle used.

In many embodiments, the thermally stable backfill layer includes zirconia, titania, alumina, boron carbide, or silicon carbide nanoparticles. In some embodiments, the thermally stable backfill layer includes zirconia. In some embodiments, the thermally stable backfill layer includes titania. In some embodiments, the thermally stable backfill layer includes alumina. In some embodiments, the thermally stable backfill layer includes boron carbide. In some embodiments, the thermally stable backfill layer includes silicon carbide.

Within the class of semiconductors include nanoparticles known as "quantum dots," which have interesting electronic and optical properties that can be used in a range of applications. Quantum dots can be produced from binary alloys such as cadmium selenide, cadmium sulfide, indium arsenide, and indium phosphide, or from ternary alloys such as cadmium selenide sulfide, and the like. Companies that sell quantum dots include Nanoco Technologies (Manchester, UK) and Nanosys (Palo Alto, Calif.).

Examples of suitable inorganic nanoparticles include elements known as rare earth elements and their oxides, such as lanthanum (La), cerium ($CeO_2$), praseodymium ($Pr_6O_{11}$), neodymium ($Nd_2O_3$), samarium ($Sm_2O_3$), europium ($Eu_2O_3$), gadolinium ($Gd_2O_3$), terbium ($Tb_4O_7$), dysprosium ($Dy_2O_3$), holmium ($Ho_2O_3$), erbium ($Er_2O_3$), thulium ($Tm_2O_3$), ytterbium ($Yb_2O_3$) and lutetium ($Lu_2O_3$). Additionally, phosphorecent materials known as "phosphors" may be included in the thermally stable backfill material. These may include calcium sulfide with strontium sulfide with bismuth as an activator (CaxSr)S:Bi, Zinc sulfide with copper "GS phosphor", mixtures of zinc sulfide and cadmium sulfide, strontium aluminate activated by Europium ($SrAl_2O_4$:Eu(II):Dy(III)), $BaMgAl_{10}O_{17}$:$Eu^{2+}$ (BAM), $Y_2O_3$:Eu, doped ortho-silicates, Yttrium aluminium garnet (YAG) and Lutetium aluminium garnet (LuAG) containing materials, any combinations thereof, and the like. A commercial example a phosphor may include one of the ISI-PHOR™ inorganic phosphors (available from Merck KGaA, Darmstadt, Germany).

The nanoparticles are typically treated with a surface treatment agent. Surface-treating the nano-sized particles can provide a stable dispersion in the polymeric resin. Preferably, the surface-treatment stabilizes the nanoparticles so that the particles will be well dispersed in a substantially homogeneous composition. Furthermore, the nanoparticles can be modified over at least a portion of its surface with a surface treatment agent so that the stabilized particle can copolymerize or react with the parts of the composition during curing. In general, a surface treatment agent has a first end that will attach to the particle surface (covalently, ionically or through strong physisorption) and a second end that imparts compatibility of the particle with the composition and/or reacts with resin during curing. Examples of surface treatment agents include alcohols, amines, carboxylic acids, sulfonic acids, phosphonic acids, silanes and titanates. The preferred type of treatment agent is determined, in part, by the chemical nature of the metal oxide surface. Silanes are preferred for silica and other for siliceous fillers. Silanes and carboxylic acids are preferred for metal oxides such as zirconia. The surface modification can be done either subsequent to mixing with the monomers or after mixing. It is preferred in the case of silanes to react the silanes with the particle or nanoparticle surface before incorporation into the composition. The required amount of surface modifier is dependent upon several factors such particle size, particle type, modifier molecular weight, and modifier type. In general it is preferred that approximately a monolayer of modifier is attached to the surface of the particle. The attachment procedure or reaction conditions required also depend on the surface modifier used. For silanes, it is preferred to surface treat at elevated temperatures under acidic or basic conditions for from 1-24 hr approximately. Surface treatment agents such as carboxylic acids may not require elevated temperatures or extended time.

Representative embodiments of surface treatment agents suitable for the compositions include compounds such as, for example, isooctyl trimethoxy-silane, N-(3-triethoxysilylpropyl) methoxyethoxyethyl carbamate ($PEG_3TES$), N-(3-triethoxysilylpropyl) methoxyethoxyethyl carbamate ($PEG_2TES$), 3-(methacryloyloxy)propyltrimethoxysilane, 3-acryloxypropyltrimethoxysilane, 3-(methacryloyloxy)propyltriethoxysilane, 3-(methacryloyloxy) propylmethyldimethoxysilane, 3-(acryloyloxypropyl)methyldimethoxysilane, 3-(methacryloyloxy)propyldimethylethoxysilane, 3-(methacryloyloxy) propyldimethylethoxysilane, vinyldimethylethoxysilane, phenyltrimethoxysilane, n-octyltrimethoxysilane, dodecyltrimethoxysilane, octadecyltrimethoxysilane, propyltrimethoxysilane, hexyltrimethoxysilane, vinylmethyldiacetoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris(2-methoxyethoxy) silane, styrylethyltrimethoxysilane, mercaptopropyltrimethoxysilane, 3-5 glycidoxypropyltrimethoxysilane, acrylic acid, methacrylic acid, oleic acid, stearic acid, dodecanoic acid, 2-[2-(2-methoxyethoxy) ethoxy]acetic acid (MEEAA), beta-carboxyethylacrylate, 2-(2-methoxyethoxy)acetic acid, methoxyphenyl acetic acid, and mixtures thereof. Further, a proprietary silane surface modifier, commercially available from OSI Specialties, Crompton South Charleston, W. Va. under the trade designation "Silquest A1230", has been found particularly suitable.

In some embodiments the thermally stable molecular species includes a metal, metal oxide or metal oxide precursor. Metal oxide precursors may be used in order to act as an amorphous "binder" for inorganic nanoparticles, or they may be used alone. Sol-gel techniques may be used to react these precursors in order to cure the material into a solid mass and are known to those skilled in the art. Suitable metal oxide precursors include alkyl titanates such as titanium (IV) butoxide, n-propyl titanate, titanium triethanolamine, titanium phosphate glycol, 2-ethylhexyl titanate, titanium (IV) ethoxide, titanium (IV) isopropoxide, and the like. These are commercially available under the "TYZOR" trade name owned by Dorf-Ketal Inc. (Houston, Tex.). Also suitable metal oxide precursors include zirconium chloride or zirconium(IV) alkoxides such as zirconium (IV) acrylate, zirconium(IV) tetraisopropoxide, zirconium(IV) tetraethoxide, zirconium(IV) tetrabutoxide, and the like, all available from Aldrich (St. Louis, Mo.). Also suitable metal oxide precursors include hafnium(V) chloride or hafnium alkoxides such as hafnium(IV) carboxyethyl acrylate, hafnium (IV) tetraisopropoxide, hafnium(IV) tert-butoxide, hafnium (IV) n-butoxide, also available from Aldrich (St. Louis, Mo.). These materials can also be used as inorganic nanomaterials in the sacrificial template layer.

Sacrificial Materials

The sacrificial layer is a material capable of being baked out or otherwise removed while leaving the structured surface layer, substantially intact. The sacrificial layer includes, for example, the sacrificial template layer and the optional sacrificial releasable layer, depending upon a construction of the transfer film. The structured surface of the sacrificial layer can be formed through embossing, a replication process, extrusion, casting, or surface structuring, for example. The structured surface can include nanostructures, microstructures, or hierarchical structures. Nanostructures comprise features having at least one dimension (e.g., height, width, or length) less than or equal to two microns. Microstructures comprise features having at least one dimension (e.g., height, width, or length) from 1 micron to 2 millimeter. Hierarchical structures are combinations of nanostructures and/or microstructures.

The sacrificial layer (e.g., 12) can comprise any material as long as the desired properties are obtained. Preferably, the sacrificial layer is made from a polymerizable composition comprising polymers having number average molecular weights of about 1,000 Da or less (e.g., monomers and oligomers). Particularly suitable monomers or oligomers have molecular weights of about 500 Da or less, and even more particularly suitable polymerizable molecules have molecular weights of about 200 Da or less. Said polymerizable compositions are typically cured using actinic radiation, e.g., visible light, ultraviolet radiation, electron beam radiation, heat and combinations thereof, or any of a variety of conventional anionic, cationic, free radical or other polymerization techniques, which can be photochemically or thermally initiated.

Useful polymerizable compositions comprise curable functional groups known in the art, such as epoxide groups, allyloxy groups, (meth)acrylate groups, epoxide, vinyl, hydroxyl, acetoxy, carboxylic acid, amino, phenolic, aldehyde, cinnamate, alkene, alkyne, ethylenically unsaturated groups, vinyl ether groups, and any derivatives and any chemically compatible combinations thereof.

The polymerizable composition used to prepare the sacrificial materials may be monofunctional or multifunctional (e.g., di-, tri-, and tetra-) in terms of radiation curable moieties. Examples of suitable monofunctional polymerizable precursors include styrene, alpha-methylstyrene, substituted styrene, vinyl esters, vinyl ethers, octyl (meth) acrylate, nonylphenol ethoxylate (meth)acrylate, isobornyl (meth)acrylate, isononyl (meth)acrylate, 2-(2-ethoxyethoxy) ethyl (meth)acrylate, 2-ethylhexyl (meth)acrylate, lauryl (meth)acrylate, beta-carboxyethyl (meth)acrylate, isobutyl (meth)acrylate, cycloaliphatic epoxide, alpha-epoxide, 2-hydroxyethyl (meth)acrylate, isodecyl (meth)acrylate, dodecyl (meth)acrylate, n-butyl (meth)acrylate, methyl (meth)acrylate, hexyl (meth)acrylate, (meth)acrylic acid, N-vinylcaprolactam, stearyl (meth)acrylate, hydroxy functional caprolactone ester (meth)acrylate, isooctyl (meth)acrylate, hydroxyethyl (meth)acrylate, hydroxypropyl (meth)acrylate, hydroxyisopropyl (meth)acrylate, hydroxybutyl (meth) acrylate, hydroxyisobutyl (meth)acrylate, tetrahydrofuryl (meth)acrylate, and any combinations thereof.

Examples of suitable multifunctional polymerizable precursors include ethyl glycol di(meth)acrylate, hexanediol di(meth)acrylate, triethylene glycol di(meth)acrylate, tetraethylene glycol di(meth)acrylate, trimethylolpropane tri (meth)acrylate, trimethylolpropanepropane tri(meth)acrylate, glycerol tri(meth)acrylate, pentaerythritol tri(meth) acrylate, pentaerythritol tetra(meth)acrylate, neopentyl glycol di(meth)acrylate, bisphenol A di(meth)acrylate, poly (1,4-butanediol) di(meth)acrylate, any substituted, ethoxylated or propoxylated versions of the materials listed above, or any combinations thereof.

The polymerization reactions generally lead to the formation of a three-dimensional "crosslinked" macromolecular network and are also known in the art as negative-tone photoresists, as reviewed by Shaw et al., "Negative photoresists for optical lithography," IBM Journal of Research and Development (1997) 41, 81-94. The formation of the network may occur through either covalent, ionic, or hydrogen bonding, or through physical crosslinking mechanisms such as chain entanglement. The reactions can also be initiated through one or more intermediate species, such as free-radical generating photoinitiators, photosensitizers, photoacid generators, photobase generators, or thermal acid generators. The type of curing agent used depends on the polymerizable precursor used and on the wavelength of the radiation used to cure the polymerizable precursor. Examples of suitable commercially available free-radical generating photoinitiators include benzophenone, benzoin ether, and acylphosphine photoinitiators, such as those sold under the trade designations "IRGACURE" and "DAROCUR" from Ciba Specialty Chemicals, Tarrytown, N.Y. Other exemplary photoinitiators include, 2,2-dimethoxy-2-phenylacetophenone (DMPAP), 2,2-dimethoxyacetophenone (DMAP), xanthone, and thioxanthone.

Co-initiators and amine synergists may also be included to improve curing rates. Suitable concentrations of the curing agent in the crosslinking matrix range from about 1 wt. % to about 10 wt. %, with particularly suitable concentrations ranging from about 1 wt. % to about 5 wt. %, based on the entire weight of the polymerizable precursor. The polymerizable precursor may also include optional additives, such as heat stabilizers, ultraviolet light stabilizers, free-radical scavengers, and combinations thereof. Examples of suitable commercially available ultraviolet light stabilizers include benzophenone-type ultraviolet absorbers, which are available under the trade designation "UVINOL 400" from BASF Corp., Parsippany, N.J.; under the trade designation "CYASORB UV-1164" from Cytec Industries, West Patterson, N.J.; and under the trade designations "TINUVIN 900," "TINUVIN 123" and "TINUVIN 1130" from Ciba Specialty chemicals, Tarrytown. N.Y. Examples of suitable concentrations of ultraviolet light stabilizers in the polymerizable precursor range from about 0.1 wt. % to about 10 wt. %, with particularly suitable total concentrations ranging from about 1 wt. % to about 5 wt. %, relative to the entire weight of the polymerizable precursor.

Examples of suitable free-radical scavengers include hindered amine light stabilizer (HALS) compounds, hydroxylamines, sterically hindered phenols, and combinations thereof. Examples of suitable commercially available HALS compounds include the trade designated "TINUVIN 292" from Ciba Specialty Chemicals, Tarrytown, N.Y., and the trade designated "CYASORB UV-24" from Cytec Industries, West Patterson, N.J. Examples of suitable concentrations of free radical scavengers in the polymerizable precursor range from about 0.05 wt. % to about 0.25 wt. %.

Patterned structured template layers can be formed by depositing a layer of a radiation curable composition onto one surface of a radiation transmissive carrier to provide a layer having an exposed surface, contacting a master with a preformed surface bearing a pattern capable of imparting a three-dimensional structure of precisely shaped and located interactive functional discontinuities including distal surface portions and adjacent depressed surface portions into the exposed surface of the layer of radiation curable composition on said carrier under sufficient contact pressure to impart said pattern into said layer, exposing said curable composition to a sufficient level of radiation through the carrier to cure said composition while the layer of radiation curable composition is in contact with the patterned surface of the master. This cast and cure process can be done in a continuous manner using a roll of carrier, depositing a layer of curable material onto the carrier, laminating the curable material against a master and curing the curable material using actinic radiation. The resulting roll of carrier with a patterned, structured template disposed thereon can then be rolled up. This method is disclosed, for example, in U.S. Pat. No. 6,858,253 (Williams et al.).

Other materials that may be used for the sacrificial layer include, polyvinyl alcohol (PVA), ethylcellulose, methylcellulose, polynorbornenes, poly(methylmethacrylate) (PMMA), poly(vinylbutyral), poly(cyclohexene carbonate), poly(cyclohexene propylene) carbonate, poly(ethylene carbonate), poly(propylene carbonate) and other aliphatic polycarbonates, and any copolymers or blends thereof, and other materials described in chapter 2, section 2.4 "Binders" of R. E. Mistler, E. R. Twiname, Tape Casting: Theory and Practice, American Ceramic Society, 2000. There are many commercial sources for these materials. These materials are typically easy to remove via dissolution or thermal decomposition via pyrolysis or combustion. Thermal heating is typically part of many manufacturing processes and thus removal of the sacrificial material may be accomplished during an existing heating step. For this reason, thermal decomposition via pyrolysis or combustion is a more preferred method of removal.

There are several properties that are preferred in the sacrificial materials. The material should be capable of being coated onto a substrate via extrusion, knife coating, solvent coating, cast and cure, or other typical coating methods. It is preferred that the material be a solid at room temperature. For thermoplastic sacrificial materials, it is preferred that the glass transition temperature (Tg) is low enough to allow it to be embossed by a heated tool. Thus, it is preferred that the sacrificial material have a Tg above 25° C., more preferred above 40° C. and most preferred above 90° C.

Another material property that is desired for the sacrificial material is that its decomposition temperature be above the curing temperature of the backfill material(s). Once the backfill material is cured, the structured layer is permanently formed and the sacrificial template layer can be removed via any one of the methods listed above. Materials that thermally decompose with low ash or low total residue are preferred over those that have higher residuals. Residue left behind on a substrate may adversely impact electrical and or optical properties such as the conductivity, transparency or color of the final product. Since it is desirable to minimize any changes to these properties in the final product, residual levels of less than 1000 ppm are preferred. Residuals levels of less than 500 ppm are more preferred and residual level below 50 ppm are most preferred.

The term "cleanly baked out" means that the sacrificial layer can be removed by pyrolysis or combustion without leaving a substantial amount of residual material such as ash. Examples of preferred residual levels are provided above, although different residual levels can be used depending upon a particular application.

Sacrificial Adhesive Layer

The sacrificial adhesive layer can be implemented with any material enhancing adhesion of the transfer film to the receptor substrate without substantially adversely affecting the performance of the transfer film. This layer can also be described as a adhesion promoting layer. The sacrificial adhesive layer is capable of being cleanly baked out during the methods described herein.

Thus, embodiments of LAMINATION TRANSFER FILMS FOR FORMING ARTICLES WITH REENTRANT STRUCTURES are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A transfer film comprising:
   a carrier film;
   a sacrificial template layer disposed on the carrier film and comprising reentrant forming template features;
   a thermally stable backfill layer having a first surface conforming to the reentrant forming template features and forming reentrant features and an opposing planar second surface.

2. The transfer film according to claim 1, wherein the thermally stable backfill material comprises an organosilicon polymer.

3. The transfer film according to claim 1, wherein the reentrant forming template features are capable of being baked out while leaving a thermally stable reentrant feature layer.

4. The transfer film according to claim 1, wherein the carrier film comprises a release layer separating the carrier film from the sacrificial template layer.

5. The transfer film according to claim 1, wherein the reentrant feature comprises an elliptic paraboloid.

6. The transfer film according to claim 1, wherein the reentrant feature comprises a segment of a sphere.

7. The transfer film according to claim 1, wherein the reentrant feature forms a lens feature.

8. The transfer film according to claim 1, wherein the reentrant feature comprises micro or nanostructure.

9. The transfer film according to claim 1, wherein the thermally stable backfill layer is inelastic.

10. The transfer film according to claim 1, wherein the sacrificial template layer is inelastic.

11. A method of forming a transfer film, comprising:
    disposing a sacrificial template layer on a carrier film;

forming reentrant forming template features in the sacrificial template layer; and coating a thermally stable backfill material on the sacrificial template layer to form a thermally stable backfill layer having a first surface conforming to the reentrant forming template features and an opposing planar second surface, forming a lamination transfer film.

12. The method according to claim 11, wherein the forming step comprises embossing the sacrificial template layer to form first features and then mechanically or thermally deforming the first features to form reentrant forming template features.

13. The method according to claim 11, wherein the forming step comprises disposing a masking layer on the sacrificial template layer and etching the sacrificial template layer through openings in the masking layer to form the reentrant forming template features in the sacrificial template layer.

14. The method according to claim 11, wherein the template features comprise nano or microstructure and the thermally stable backfill layer conforms to the nano or microstructure and the reentrant forming template features.

15. The method according to claim 11, wherein the forming step comprises disposing the sacrificial template layer on removable beads to form the reentrant forming template features in the sacrificial template layer.

16. The method according to claim 11, wherein the sacrificial template layer comprises beads formed of sacrificial material and then coating the thermally stable backfill material on the beads.

17. A method of using the transfer film of claim 1, the method comprising:

laminating the planar second surface of the transfer film to a receptor substrate;

baking out the sacrificial template layer to form a thermally stable backfill layer having reentrant features.

18. The method according to claim 17, further comprising removing the carrier film from the sacrificial template layer before the baking out step.

19. The method according to claim 17, wherein the reentrant features are disposed on microstructure features of the thermally stable backfill layer.

20. The method according to claim 17, wherein the reentrant feature comprises an elliptic paraboloid.

21. The method according to claim 17, wherein the reentrant feature comprises a segment of a sphere.

22. The method according to claim 17, wherein the reentrant feature forms a lens feature.

\* \* \* \* \*

UNITED STATES PATENT AND TRADEMARK OFFICE
CERTIFICATE OF CORRECTION

PATENT NO. : 10,220,600 B2
APPLICATION NO. : 15/111355
DATED : March 5, 2019
INVENTOR(S) : Martin Wolk et al.

It is certified that error appears in the above-identified patent and that said Letters Patent is hereby corrected as shown below:

In the Specification

Column 1
Line 63, delete "FIG." and insert -- FIGS. --, therefor.

Column 2
Line 20, delete "6A:" and insert -- 6A; --, therefor.

Column 4
Line 34, delete "FIG." and insert -- FIGS. --, therefor.
Line 40, delete "FIG." and insert -- FIGS. --, therefor.
Line 65, delete "1500" and insert -- 150° --, therefor.

Column 5
Line 15, delete "topographics" and insert -- topographies --, therefor.

Column 7
Line 30, delete "poly(vinychloride);" and insert -- poly(vinylchloride); --, therefor.

Column 12
Line 11 (approx.), delete "200013," and insert -- 2000B, --, therefor.

Column 13
Line 29 (approx.), delete "layer 1" and insert -- layer 11 --, therefor.

Column 14
Line 2, delete "heads" and insert -- beads --, therefor.
Line 3, delete "back fill" and insert -- backfill --, therefor.

Signed and Sealed this
Twenty-ninth Day of October, 2019

Andrei Iancu
*Director of the United States Patent and Trademark Office*

Column 15
Line 26, delete "Company." and insert -- Company, --, therefor.
Line 47, delete "$R_xSiZ_{1-x}$," and insert -- $R_xSiZ_{4-x}$, --, therefor.
Line 55, delete "$C_1$-$C_{20}$" and insert -- $C_6$-$C_{20}$ --, therefor.
Line 67, delete "$Z_{3-a}R_aSi$-Y-Si $R_nZ_{3-n}$" and insert -- $Z_{3-n} R_n$ Si-Y-Si $R_nZ_{3-n}$ --, therefor.

Column 18
Line 26, delete "w %/o," and insert -- wt %, --, therefor.

Column 19
Line 45, delete "phosphoreccnt" and insert -- phosphorecent --, therefor.

Column 21
Line 8, delete "hafnium(V)" and insert -- hafnium(IV) --, therefor.

Column 22
Line 52, delete ""UVINOL" and insert -- "UVINUL --, therefor.

Column 23
Line 63, delete "and or" and insert -- and/or --, therefor.